United States Patent
Kang

(10) Patent No.: US 12,394,459 B2
(45) Date of Patent: Aug. 19, 2025

(54) SEMICONDUCTOR APPARATUS INCLUDING A PLURALITY OF CLOCK PATHS AND A SEMICONDUCTOR SYSTEM USING THE SAME

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 224 days.

(21) Appl. No.: 18/446,946

(22) Filed: Aug. 9, 2023

(65) Prior Publication Data

US 2024/0203469 A1 Jun. 20, 2024

(30) Foreign Application Priority Data

Dec. 20, 2022 (KR) ........................ 10-2022-0179292

(51) Int. Cl.
*G11C 7/22* (2006.01)
*G11C 7/10* (2006.01)

(52) U.S. Cl.
CPC ............ *G11C 7/222* (2013.01); *G11C 7/1057* (2013.01); *G11C 7/1072* (2013.01)

(58) Field of Classification Search
CPC ...... G11C 7/222; G11C 7/1057; G11C 7/1072
See application file for complete search history.

(56) References Cited

U.S. PATENT DOCUMENTS

| | | | |
|---|---|---|---|
| 5,790,839 A | 8/1998 | Luk et al. | |
| 8,000,166 B2 * | 8/2011 | Kim | G11C 7/22 365/189.05 |
| 8,305,837 B2 * | 11/2012 | Park | G11C 7/22 365/233.13 |
| 9,778,676 B2 | 10/2017 | Pal et al. | |
| 10,169,262 B2 * | 1/2019 | West | G11C 7/222 |
| 11,625,062 B2 | 4/2023 | Kang et al. | |
| 2023/0213961 A1 | 7/2023 | Kang et al. | |
| 2024/0192722 A1 | 6/2024 | Kang | |

FOREIGN PATENT DOCUMENTS

KR 1020210079642 A 6/2021

\* cited by examiner

*Primary Examiner* — Vanthu T Nguyen
(74) *Attorney, Agent, or Firm* — WILLIAM PARK & ASSOCIATES LTD.

(57) ABSTRACT

A semiconductor apparatus includes a plurality of clock paths, a first selecting circuit, and a multi-phase clock generating circuit. Each of the clock paths generates a corresponding clock signal pair according to an operation mode. The first selecting circuit outputs, as a reference clock signal pair, the corresponding clock signal pair. The multi-phase clock generating circuit generates first internal clock signals based on the reference clock signal pair.

23 Claims, 8 Drawing Sheets

SEMICONDUCTOR APPARATUS INCLUDING A PLURALITY OF CLOCK PATHS AND A SEMICONDUCTOR SYSTEM USING THE SAME

CROSS-REFERENCES TO RELATED APPLICATION

The present application claims priority under 35 U.S.C. § 119(a) to Korean application number 10-2022-0179292, filed on Dec. 20, 2022, in the Korean Intellectual Property Office, which is incorporated herein by reference in its entirety as set forth in full.

BACKGROUND

1. Technical Field

Various embodiments generally relate to an integrated circuit technology, and, more particularly, to a semiconductor apparatus including a plurality of clock paths and a semiconductor system using the same.

2. Related Art

An electronic device includes many electronic elements and a computer system as the electronic device includes many semiconductor apparatuses each configured by a semiconductor. The semiconductor apparatuses configuring the computer system may be synchronized with a system clock signal to perform data communication with each other. Each of the semiconductor apparatuses may generate an internal clock signal from the system clock signal to provide and receive data. The internal clock signal may have a frequency and/or a phase suitable for the performance of the semiconductor apparatus.

The semiconductor apparatus may operate according to the system clock signal having various frequencies under various operational environments. To generate, from the system clock signal having various frequencies, an internal clock signal having a frequency suitable for the performance of the semiconductor apparatus, the semiconductor apparatus may be required to change a scheme of generating the internal clock signal according to the frequency of the system clock signal.

SUMMARY

In an embodiment, a semiconductor apparatus may include a first clock path, a second clock path, a third clock path, a first selecting circuit, and a multi-phase clock generating circuit. The first clock path may be configured to buffer a system clock signal pair to generate a first clock signal pair in a first operation mode. The second clock path may be configured to multiply a frequency of the system clock signal pair to generate a second clock signal pair in a second operation mode. The third clock path may be configured to convert the system clock signal pair to a Complementary Metal-Oxide-Semiconductor (CMOS) level to generate a third clock signal pair in a third operation mode. The first selecting circuit may be configured to output, as a first reference clock signal pair, one of the first clock signal pair, the second clock signal pair, and the third clock signal pair according to the operation mode. The multi-phase clock generating circuit may be configured to generate first internal clock signals from the first reference clock signal pair.

In an embodiment, a semiconductor apparatus may include a first clock path, a second clock path, a third clock path, a first selecting circuit, a multi-phase clock generating circuit, and a second selecting circuit. The first clock path may be configured to buffer a system clock signal pair to generate a first clock signal pair in a first operation mode. The second clock path may be configured to multiply a frequency of the system clock signal pair to generate a second clock signal pair in a second operation mode. The third clock path may be configured to convert the system clock signal pair to a Complementary Metal-Oxide-Semiconductor (CMOS) level to generate a third clock signal pair and configured to buffer the system clock signal pair to a Current Mode Logic (CML) level to generate a fourth clock signal pair, in a third operation mode. The first selecting circuit may be configured to select, as a first reference clock signal pair, one of the first clock signal pair, the second clock signal pair, and the third clock signal pair according to the operation mode. The multi-phase clock generating circuit may be configured to generate first internal clock signals, second internal clock signals, and a second reference clock signal pair from the first reference clock signal pair. The second selecting circuit may be configured to select, according to the operation mode, at least one of the second reference clock signal pair and the fourth clock signal pair to output the selected pair as a third internal clock signal pair.

In an embodiment, a semiconductor apparatus may include a first clock path, a second clock path, a third clock path, a first selecting circuit, a multi-phase clock generating circuit, and a second selecting circuit. The first clock path may be configured to buffer a system clock signal pair to generate a first clock signal pair in a first operation mode. The second clock path may be configured to multiply a frequency of the system clock signal pair to generate a second clock signal pair in a second operation mode. The third clock path may be configured to convert the system clock signal pair to a Complementary Metal-Oxide-Semiconductor (CMOS) level to generate a third clock signal pair and configured to buffer the system clock signal pair to a Current Mode Logic (CML) level to generate a fourth clock signal pair, in a third operation mode. The first selecting circuit may be configured to selecting, as a first reference clock signal pair, one of the first clock signal pair, the second clock signal pair, and the third clock signal pair according to the operation mode. The multi-phase clock generating circuit may be configured to generate first internal clock signals, second internal clock signals, and a second reference clock signal pair based on at least one of a third internal clock signal pair and the first reference clock signal pair. The second selecting circuit may be configured to select one of the second reference clock signal pair and the fourth clock signal pair to output the selected pair as the third internal clock signal pair.

DETAILED DESCRIPTION

Figure 1:
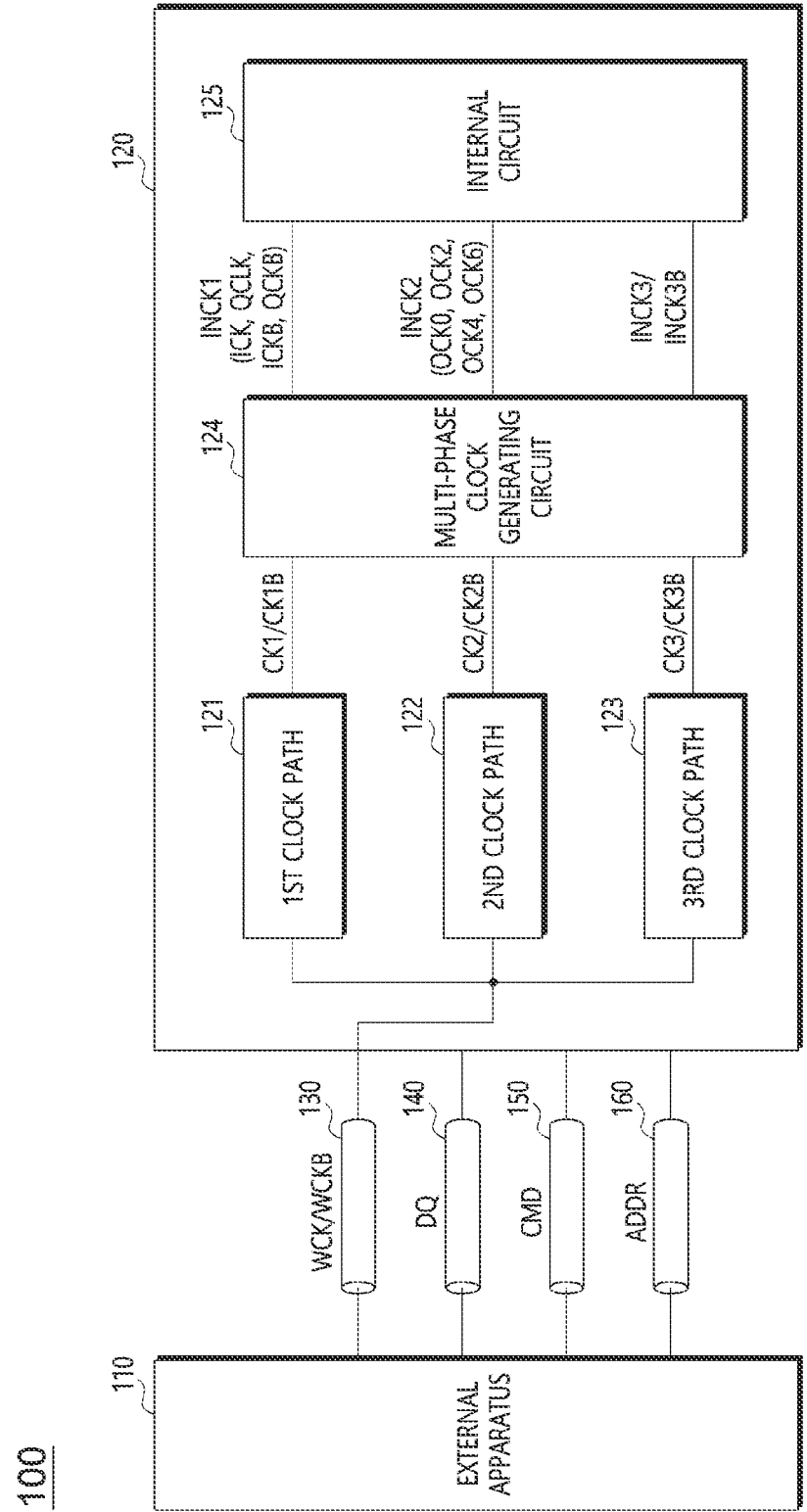
FIG. 1 is a block diagram illustrating a configuration of a semiconductor system in accordance with an embodiment.

FIG. 1 is a block diagram illustrating a configuration of a semiconductor system 100 in accordance with an embodiment. Referring to FIG. 1, the semiconductor system 100 may include an external apparatus 110 and a semiconductor apparatus 120. The semiconductor apparatus 120 may be synchronized with a system clock signal pair WCK/WCKB to perform data communication with an external apparatus 110. The external apparatus 110 may provide various control signals required for the semiconductor apparatus 120 to operate for the data communication. The external apparatus 110 may include devices of various kinds. For example, the external apparatus 110 may be a host device such as a central processing unit (CPU), a graphic processing unit (GPU), a multi-media processor (MMP), a digital signal processor, an application processor (AP), a memory controller, and so forth. In an embodiment, the external apparatus 110 may include a test device or test equipment for testing the semiconductor apparatus 120. For example, the semiconductor apparatus 120 may be a memory device. The memory device may include volatile memory or non-volatile memory. The volatile memory may include static random-access memory (static RAM: SRAM), dynamic RAM (DRAM), and synchronous DRAM (SDRAM). The non-volatile memory may include read only memory (ROM), programmable ROM (PROM), electrically erasable and programmable ROM (EEPROM), erasable programmable ROM (EPROM), flash memory, phase change RAM (PRAM), magnetic RAM (MRAM), resistive RAM (RRAM), ferroelectric RAM (FRAM), and so forth.

The semiconductor apparatus 120 may be coupled to the external apparatus 110 through a plurality of buses. Each of the plurality of buses may be a signal transmission path, a link, or a channel for transferring a signal. Each of the plurality of buses may include a plurality of transmission lines. The plurality of buses may include a clock bus 130. The clock bus 130 may be unilateral from the external apparatus 110 to the semiconductor apparatus 120. The semiconductor apparatus 120 may be coupled to the external apparatus 110 through the clock bus 130 and may receive the system clock signal pair WCK/WCKB from the external apparatus 110 through the clock bus 130. In an embodiment, the clock bus 130 may include at least two (2) clock transmission lines, through which the system clock signal pair WCK/WCKB are transferred.

The semiconductor apparatus 120 may select, based on a frequency range of the system clock signal pair WCK/WCKB, an operation mode optimal for the operation of the semiconductor apparatus 120. When the system clock signal pair WCK/WCKB has a frequency within a first frequency range, the semiconductor apparatus 120 may operate in a first operation mode. When the system clock signal pair WCK/WCKB has a frequency within a second frequency range higher than the first frequency range, the semiconductor apparatus 120 may operate in a second operation mode. When the system clock signal pair WCK/WCKB has a frequency within a third frequency range higher than the second frequency range, the semiconductor apparatus 120 may operate in a third operation mode. The first to third frequency ranges may be classified respectively as a low frequency range, a middle frequency range, and a high frequency range. The classification of the frequency ranges might not be based on a particular value of the frequency. For example, when the system clock signal pair WCK/WCKB has a frequency within the low frequency range, the semiconductor apparatus 120 may operate in the first operation mode. When the system clock signal pair WCK/WCKB has a frequency within the middle frequency range, the semiconductor apparatus 120 may operate in the second operation mode. When the system clock signal pair WCK/WCKB has a frequency within the high frequency range, the semiconductor apparatus 120 may operate in the third operation mode.

The semiconductor apparatus 120 may perform various operations according to the operation mode. For example, the semiconductor apparatus 120 may perform, in the first operation mode, a test operation together with the external apparatus 110. The test operation performed in the first operation mode may include a wafer test operation. The wafer test operation may be performed to test the performance of the semiconductor apparatus 120 when the semiconductor apparatus 120 is formed on a wafer. The semiconductor apparatus 120 may perform, in the second operation mode, a test operation together with the external apparatus 110. The test operation performed in the second operation mode may include a package test operation. The package test operation may be performed to test the performance of the semiconductor apparatus 120 when the semiconductor apparatus 120 is packaged. The semiconductor apparatus 120 may perform, in the third operation mode, a normal operation together with the external apparatus 110. The normal operation may be any operation other than the above-described test operations and may be performed between the external apparatus 110 and the semiconductor apparatus 120.

The external apparatus 110 may generate the system clock signal pair WCK/WCKB having a frequency within the first frequency range and having a phase difference of 180° and may provide the system clock signal pair WCK/WCKB to the semiconductor apparatus 120. The external apparatus 110 may generate the system clock signal pair WCK/WCKB having a frequency within the second frequency range and having a phase difference of 90° and may provide the system clock signal pair WCK/WCKB to the semiconductor apparatus 120. The external apparatus 110 may generate the system clock signal pair WCK/WCKB having a frequency within the third frequency range and having a phase difference of 180° and may provide the system clock signal pair WCK/WCKB to the semiconductor apparatus 120.

The plurality of buses coupled between the external apparatus 110 and the semiconductor apparatus 120 may further include a data bus 140, a command bus 150, and an address bus 160. The data bus 140 may be bilateral between the external apparatus 110 and the semiconductor apparatus 120. Each of the command bus 150 and the address bus 160 may be unilateral from the external apparatus 110 to the semiconductor apparatus 120.

The semiconductor apparatus 120 may be coupled to the external apparatus 110 through the data bus 140 and may provide data to the external apparatus 110 or receive data from the external apparatus 110, through the data bus 140. In synchronization with the system clock signal pair WCK/WCKB, the external apparatus 110 may provide the semiconductor apparatus 120 with the data. The data bus 140 may include a plurality of data transmission lines and may transfer the data through the plurality of data transmission lines.

The semiconductor apparatus 120 may be coupled to the external apparatus 110 through the command bus 150 and may receive, through the command bus 150, a command signal CMD from the external apparatus 110. The semiconductor apparatus 120 may be coupled to the external apparatus 110 through the address bus 160 and may receive, through the address bus 160, an address signal ADDR from the external apparatus 110.

The semiconductor apparatus 120 may include a plurality of clock paths. According to the operation mode and/or the frequency of the system clock signal pair WCK/WCKB, the semiconductor apparatus 120 may select at least one of the plurality of clock paths. Through the selected clock path, the semiconductor apparatus 120 may generate an internal clock signal from the system clock signal pair WCK/WCKB.

The plurality of clock paths may include a first clock path 121, a second clock path 122, and a third clock path 123. According to the operation mode, the semiconductor apparatus 120 may select one of the first to third clock paths 121, 122, and 123. For example, the semiconductor apparatus 120 may select the first clock path 121 in the first operation mode, may select the second clock path 122 in the second operation mode, and may select the third clock path 123 in the third operation mode.

In the first operation mode, the first clock path 121 may receive the system clock signal pair WCK/WCKB. The first clock path 121 may buffer the system clock signal pair WCK/WCKB to generate a first clock signal pair CK1/CK1B. The system clock signal pair WCK/WCKB may have a phase difference of 180°, and the first clock signal pair CK1/CK1B may have a phase difference of 180°. The first clock signal pair CK1/CK1B may have substantially the same frequency as the system clock signal pair WCK/WCKB. Without any frequency change or any voltage level conversion, the first clock path 121 might only buffer the system clock signal pair WCK/WCKB to generate the first clock signal pair CK1/CK1B.

In the second operation mode, the second clock path 122 may receive the system clock signal pair WCK/WCKB. The second clock path 122 may multiply the frequency of the system clock signal pair WCK/WCKB to generate a second clock signal pair CK2/CK2B. The second clock signal pair CK2/CK2B may have a higher frequency than the system clock signal pair WCK/WCKB. For example, the second clock signal pair CK2/CK2B may have the frequency twice higher than the system clock signal pair WCK/WCKB. The system clock signal pair WCK/WCKB may have a phase difference of 90°, and the second clock signal pair CK2/CK2B may have a phase difference of 180°.

In the third operation mode, the third clock path 123 may receive the system clock signal pair WCK/WCKB. The third clock path 123 may convert the level of the system clock signal pair WCK/WCKB to generate a third clock signal pair CK3/CK3B. In the third operation mode, the system clock signal pair WCK/WCKB may be signals swinging to a Current Mode Logic (CML) level. The third clock signal pair CK3/CK3B may be signals converted from the CML level to a Complementary Metal-Oxide-Semiconductor (CMOS) level. The third clock path 123 may convert the CML level, to which the system clock signal pair WCK/WCKB swings, to the CMOS level to generate the third clock signal pair CK3/CK3B swinging to the CMOS level. The CML level may correspond to a smaller swing width than the CMOS level, which corresponds to a full swing width. The CMOS level may correspond to a greater swing width than the CML level. The system clock signal pair WCK/WCKB may have a phase difference of 180°, and the third clock signal pair CK3/CK3B may have a phase difference of 180°. For example, the third clock signal pair CK3/CK3B may have substantially the same frequency as the system clock signal pair WCK/WCKB.

The semiconductor apparatus 120 may further include a multi-phase clock generating circuit 124. The multi-phase clock generating circuit 124 may receive the first clock signal pair CK1/CK1B, the second clock signal pair CK2/CK2B, and the third clock signal pair CK3/CK3B. Based on at least one of the first clock signal pair CK1/CK1B, the second clock signal pair CK2/CK2B, and the third clock signal pair CK3/CK3B, the multi-phase clock generating circuit 124 may generate at least one internal clock signal. For example, in the first operation mode, the multi-phase clock generating circuit 124 may generate at least one internal clock signal based on the first clock signal pair CK1/CK1B. In the second operation mode, the multi-phase clock generating circuit 124 may generate at least one internal clock signal based on the second clock signal pair CK2/CK2B. In the third operation mode, the multi-phase clock generating circuit 124 may generate at least one internal clock signal based on the third clock signal pair CK3/CK3B.

For example, the internal clock signals may include first internal clock signals INCK1, second internal clock signals INCK2, and a third internal clock signal pair INCK3/INCK3B. The multi-phase clock generating circuit 124 may output, as the third internal clock signal pair INCK3/INCK3B, one of the first to third clock signal pairs CK1/CK1B, CK2/CK2B, and CK3/CK3B. The multi-phase clock generating circuit 124 may divide one of the first to third clock signal pairs CK1/CK1B, CK2/CK2B, and CK3/CK3B to generate the first internal clock signals INCK1 and the second internal clock signals INCK2. The first internal clock signals INCK1 may include a plurality of internal clock signals. The first internal clock signals INCK1 may include an internal clock signal ICK, an internal clock signal QCK, an internal clock signal ICKB, and an internal clock signal QCKB. Each of the plurality of first internal clock signals ICK, QCK, ICKB, and QCKB may have a frequency twice lower than the system clock signal pair WCK/WCKB. The second internal clock signals INCK2 may include a plurality of internal clock signals. The second internal clock signals INCK2 may include an internal clock signal OCK0, an internal clock signal OCK2, an internal clock signal OCK4, and an internal clock signal OCK6 signal. Each of the second internal clock signals OCK0, OCK2, OCK4, and OCK6 may have a frequency four (4) times lower than the system clock signal pair WCK/WCKB. Described later will be details on how to generate the first internal clock signals INCK1 and the second internal clock signals INCK2.

The semiconductor apparatus 120 may further include an internal circuit 125. The internal circuit 125 may receive at least one internal clock from the multi-phase clock generating circuit 124. The internal circuit 125 may receive the first internal clock signals INCK1, the second internal clock signals INCK2, and the third internal clock signal pair INCK3/INCK3B. The internal circuit 125 may operate based on the first internal clock signals INCK1, the second internal clock signals INCK2, and the third internal clock signal pair INCK3/INCK3B. For example, the internal circuit 125 may synchronize a control signal, which is provided from the external apparatus 110, with at least one of the first internal clock signals INCK1, the second internal clock signals INCK2, and the third internal clock signal pair INCK3/INCK3B or may latch the control signal in synchronization with at least one of the first internal clock signals INCK1, the second internal clock signals INCK2, and the third internal clock signal pair INCK3/INCK3B. The control signal provided from the external apparatus 110 may include at least one of the command signal CMD and the address signal ADDR. In an embodiment, based on at least one of the first internal clock signals INCK1, the second internal clock signals INCK2, and the third internal clock signal pair INCK3/INCK3B, the internal circuit 125 may receive data from the external apparatus 110 or may provide data to the external apparatus 110. In an embodiment, based on at least one of the first internal clock signals INCK1, the second internal clock signals INCK2, and the third internal clock signal pair INCK3/INCK3B, the internal circuit 125 may generate another internal clock signal.

Figure 2:
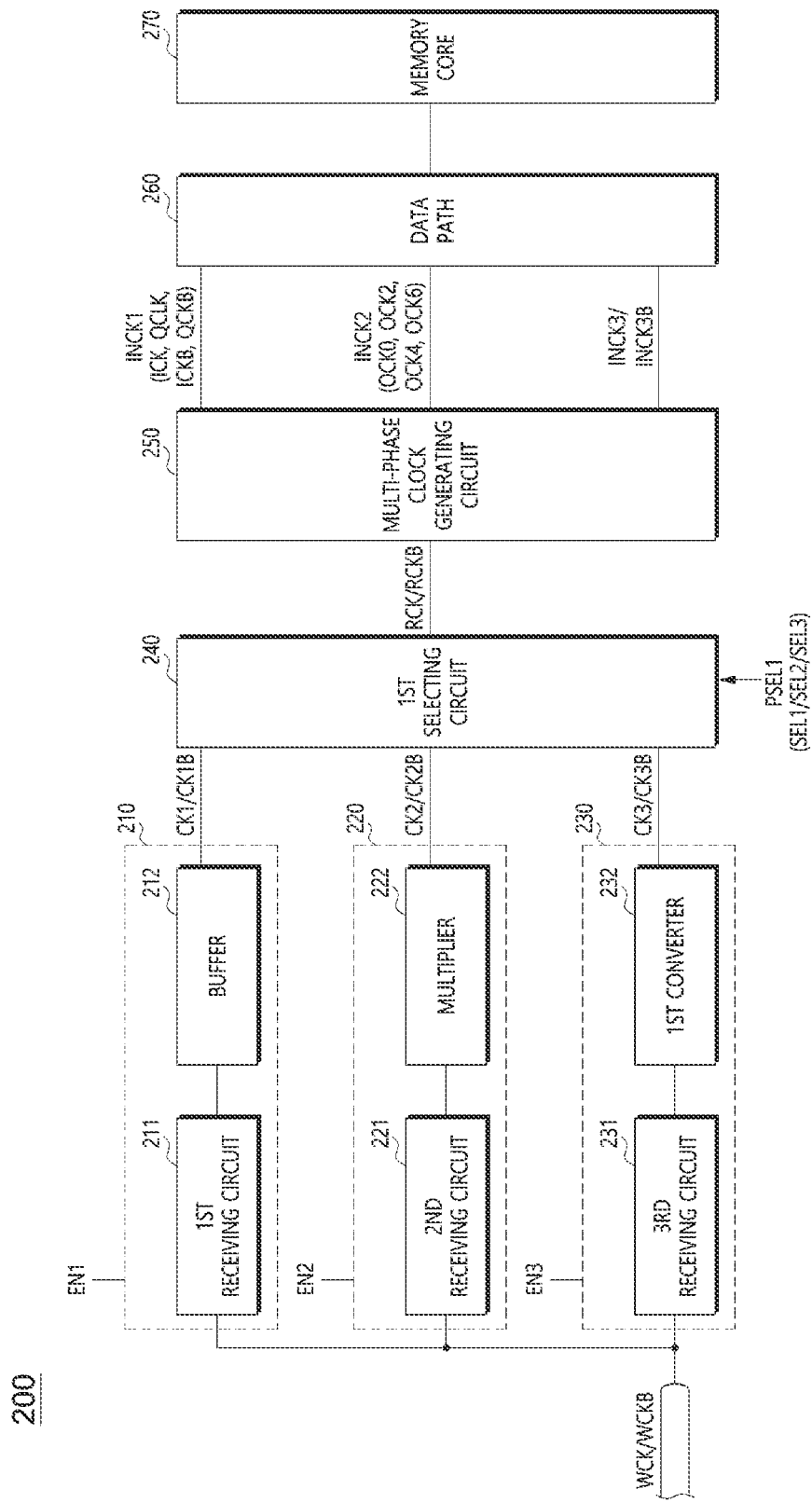
FIG. 2 is a block diagram illustrating a configuration of a semiconductor apparatus in accordance with an embodiment.

FIG. 2 is a block diagram illustrating a configuration of a semiconductor apparatus 200 in accordance with an embodiment. The semiconductor apparatus 200 may be applied as the semiconductor apparatus 120 illustrated in FIG. 1. The semiconductor apparatus 200 may determine, based on the frequency range of the system clock signal pair WCK/WCKB, an operation mode optimal for the operation of the semiconductor apparatus 200. When the system clock signal pair WCK/WCKB has a frequency within the first frequency range, the semiconductor apparatus 200 may operate in the first operation mode. When the system clock signal pair WCK/WCKB has a frequency within the second frequency range higher than the first frequency range, the semiconductor apparatus 200 may operate in the second operation mode. When the system clock signal pair WCK/WCKB has a frequency within the third frequency range higher than the second frequency range, the semiconductor apparatus 200 may operate in the third operation mode. The first to third frequency ranges may be classified respectively as the low frequency range, the middle frequency range, and the high frequency range. The classification of the frequency ranges might not be based on a particular value of the frequency. For example, when the system clock signal pair WCK/WCKB has a frequency within the low frequency range, the semiconductor apparatus 200 may operate in the first operation mode. When the system clock signal pair WCK/WCKB has a frequency within the middle frequency range, the semiconductor apparatus 200 may operate in the second operation mode. When the system clock signal pair WCK/WCKB has a frequency within the high frequency range, the semiconductor apparatus 200 may operate in the third operation mode.

The semiconductor apparatus 200 may include a plurality of clock paths. According to the operation mode, the semiconductor apparatus 200 may select one of the plurality of clock paths to operate through the selected clock path. The plurality of clock paths may include a first clock path 210, a second clock path 220, and a third clock path 230.

The first clock path 210 may be activated in the first operation mode. When the first clock path 210 is activated, the first clock path 210 may receive the system clock signal pair WCK/WCKB and may buffer the system clock signal pair WCK/WCKB to generate the first clock signal pair CK1/CK1B. The system clock signal pair WCK/WCKB may have a phase difference of 180°, and the first clock signal pair CK1/CK1B may have a phase difference of 180°. The first clock signal pair CK1/CK1B may have the same frequency as the system clock signal pair WCK/WCKB. Without any frequency change or any voltage level conversion, the first clock path 210 might only buffer the system clock signal pair WCK/WCKB to generate the first clock signal pair CK1/CK1B. The first clock path 210 may include a first receiving circuit 211 and a buffer 212. The first receiving circuit 211 may receive the system clock signal pair WCK/WCKB to differentially amplify the system clock signal pair WCK/WCKB. The first receiving circuit 211 may output the differentially amplified signals. The buffer 212 may buffer the output signals from the first receiving circuit 211. That is, the buffer 212 may differentially amplify the output signals to generate a first clock signal pair CK1/CK1B. The buffer 212 may be a differential amplifier configured to differentially amplify the output signals from the first receiving circuit 211.

In an embodiment, the first clock path 210 may be selectively activated according to a first activating signal EN1. For example, the first activating signal EN1 may be enabled in the first operation mode to activate the first clock path 210. The first receiving circuit 211 and the buffer 212 may be activated when the first activating signal EN1 is enabled. When the first receiving circuit 211 is activated, the first receiving circuit 211 may receive the system clock signal pair WCK/WCKB and may differentially amplify the system clock signal pair WCK/WCKB to output the differentially amplified signals. When the buffer 212 is activated, the buffer 212 may buffer the output signals from the first receiving circuit 211 to generate the first clock signal pair CK1/CK1B. When the first activating signal EN1 is disabled, at least one of the first receiving circuit 211 and the buffer 212 may be deactivated. When at least one of the first receiving circuit 211 and the buffer 212 is deactivated, the first clock path 210 might not receive the system clock signal pair WCK/WCKB and might not generate the first clock signal pair CK1/CK1B.

The second clock path 220 may be activated in the second operation mode. When the second clock path 220 is activated, the second clock path 220 may receive the system clock signal pair WCK/WCKB and may multiply the frequency of the system clock signal pair WCK/WCKB to generate a second clock signal pair CK2/CK2B. The system clock signal pair WCK/WCKB may have a phase difference of 90° and the second clock signal pair CK2/CK2B may have a phase difference of 180°. The second clock signal pair CK2/CK2B may have a higher frequency than the system clock signal pair WCK/WCKB. For example, the second clock signal pair CK2/CK2B may have a frequency twice higher than the system clock signal pair WCK/WCKB. The second clock path 220 may include a second receiving circuit 221 and a multiplier 222. The second receiving circuit 221 may receive the system clock signal pair WCK/WCKB to differentially amplify the system clock signal pair WCK/WCKB. The second receiving circuit 221 may output the differentially amplified signals. The multiplier 222 may multiply the frequency of the output signals from the second receiving circuit 221 to generate the second clock signal pair CK2/CK2B. For example, the multiplier 222 may multiply the frequency of the output signals from the second receiving circuit 221 to generate the second clock signal pair CK2/CK2B having the frequency twice higher than the system clock signal pair WCK/WCKB.

In an embodiment, the second clock path 220 may be selectively activated according to a second activating signal EN2. For example, the second activating signal EN2 may be enabled in the second operation mode to activate the second clock path 220. The second receiving circuit 221 and the multiplier 222 may be activated when the second activating signal EN2 is enabled. When the second receiving circuit 221 is activated, the second receiving circuit 221 may receive the system clock signal pair WCK/WCKB and may differentially amplify the system clock signal pair WCK/WCKB to output the differentially amplified signals. When the multiplier 222 is activated, the multiplier 222 may multiply the frequency of the output signals from the second receiving circuit 221 to generate the second clock signal pair CK2/CK2B. When the second activating signal EN2 is disabled, at least one of the second receiving circuit 221 and the multiplier 222 may be deactivated. When at least one of the second receiving circuit 221 and the multiplier 222 is deactivated, the second clock path 220 might not receive the system clock signal pair WCK/WCKB and might not generate the second clock signal pair CK2/CK2B.

The third clock path 230 may be activated in the third operation mode. When the third clock path 230 is activated, the third clock path 230 may receive the system clock signal pair WCK/WCKB and may convert the level of the system clock signal pair WCK/WCKB to generate a third clock signal pair CK3/CK3B. In the third operation mode, the system clock signal pair WCK/WCKB may be signals swinging to the CML level. The third clock signal pair CK3/CK3B may be a signal converted from the CML level to the CMOS level. The third clock path 230 may convert the CML level, to which the system clock signal pair WCK/WCKB swings, to the CMOS level to generate the third clock signal pair CK3/CK3B swinging to the CMOS level. The CML level may correspond to a less swing width than the CMOS level, which corresponds to a full swing width. The CMOS level may correspond to a greater swing width than the CML level. The system clock signal pair WCK/WCKB may have a phase difference of 180°, and the third clock signal pair CK3/CK3B may have a phase difference of 180°. For example, the third clock signal pair CK3/CK3B may have substantially the same frequency as the system clock signal pair WCK/WCKB. The third clock path 230 may include a third receiving circuit 231 and a first converter 232. The third receiving circuit 231 may receive the system clock signal pair WCK/WCKB to differentially amplify the system clock signal pair WCK/WCKB. The third receiving circuit 231 may output the differentially amplified signals. The first converter 232 may convert the level of the output signals from the third receiving circuit 231 to generate the third clock signal pair CK3/CK3B. For example, the first converter 232 may convert, from the CML level to the CMOS level, the level of the output signals from the third receiving circuit 231. The CML level may correspond to a less swing width than the CMOS level, which corresponds to a full swing width. The CMOS level may correspond to a greater swing width than the CML level.

In an embodiment, the third clock path 230 may be selectively activated according to a third activating signal EN3. For example, the third activating signal EN3 may be enabled in the third operation mode to activate the third clock path 230. The third receiving circuit 231 and the first converter 232 may be activated when the third activating signal EN3 is enabled. When the third receiving circuit 231 is activated, the third receiving circuit 231 may receive the system clock signal pair WCK/WCKB and may differentially amplify the system clock signal pair WCK/WCKB to output the differentially amplified signals. When the first converter 232 is activated, the first converter 232 may convert the level of the output signals from the third receiving circuit 231 to generate the third clock signal pair CK3/CK3B. When the third activating signal EN3 is disabled, at least one of the third receiving circuit 231 and the first converter 232 may be deactivated. When at least one of the third receiving circuit 231 and the first converter 232 is deactivated, the third clock path 230 might not receive the system clock signal pair WCK/WCKB and might not generate the third clock signal pair CK3/CK3B.

The semiconductor apparatus 200 may further include a first selecting circuit 240 and a multi-phase clock generating circuit 250. According to the operation mode, the first selecting circuit 240 may selectively output, as a first reference clock signal pair RCK/RCKB, one of the first clock signal pair CK1/CK1B, the second clock signal pair CK2/CK2B, and the third clock signal pair CK3/CK3B. The first selecting circuit 240 may receive a first path selecting signal PSEL1 and may select, based on the first path selecting signal PSEL1, one of the first clock signal pair CK1/CK1B, the second clock signal pair CK2/CK2B, and the third clock signal pair CK3/CK3B. The first path selecting signal PSEL1 may be a signal indicating one of the first to third operation modes. For example, the first path selecting signal PSEL1 may be any of a first selecting signal SEL1, a second selecting signal SEL2, and a third selecting signal SEL3.

The first path selecting signals PSEL1 may be generated from a control signal from the external apparatus 110 of FIG. 1 or may be generated according to a result of detecting, by the semiconductor apparatus 200, the frequency of the system clock signal pair WCK/WCKB. In an embodiment, the first path selecting signals PSEL1 may include a plurality of bits and the first path selecting signals PSEL1 may be any of the first to third selecting signals SEL1, SEL2, and SEL3 through the change of logic levels of the plural bits. For example, the first selecting signal SEL1 may be enabled in the first operation mode to select the first clock path 210, the second selecting signal SEL2 may be enabled in the second operation mode to select the second clock path 220, and the third selecting signal SEL3 may be enabled in the third operation mode to select the third clock path 230.

In an embodiment, when the first selecting signal SEL1 is enabled, the first selecting circuit 240 may output, as the first reference clock signal pair RCK/RCKB, the first clock signal pair CK1/CK1B from the first clock path 210. In an embodiment, when the second selecting signal SEL2 is enabled, the first selecting circuit 240 may output, as the first reference clock signal pair RCK/RCKB, the second clock signal pair CK2/CK2B from the second clock path 220. In an embodiment, when the third selecting signal SEL3 is enabled, the first selecting circuit 240 may output, as the first reference clock signal pair RCK/RCKB, the third clock signal pair CK3/CK3B from the third clock path 230.

Based on the first reference clock signal pair RCK/RCKB, the multi-phase clock generating circuit 250 may generate first internal clock signals INCK1, second internal clock signals INCK2 and a third internal clock signal pair INCK3/INCK3B. For example, the multi-phase clock generating circuit 250 may output the first reference clock signal pair RCK/RCKB as the third internal clock signal pair INCK3/INCK3B. Also, the multi-phase clock generating circuit 250 may generate the first internal clock signals INCK1 by dividing the first reference clock signal pair RCK/RCKB. The first internal clock signals INCK1 may include a plurality of internal clock signals. Further, the multi-phase clock generating circuit 250 may generate the second internal clock signals INCK2 by dividing the first internal clock signals INCK1. The first internal clock signals INCK1 may include an internal clock signal ICK, an internal clock signal QCK, an internal clock signal ICKB, and an internal clock signal QCKB. The second internal clock signals INCK2 may include an internal clock signal OCK0, an internal clock signal OCK2, an internal clock signal OCK4, and an internal clock signal OCK6. In an embodiment, the first selecting circuit 240 may be integrated into the multi-phase clock generating circuit 250 to be an element within the multi-phase clock generating circuit 250.

The semiconductor apparatus 200 may further include a data path 260 and a memory core 270. The data path 260 may receive the first internal clock signals INCK1, the second internal clock signals INCK2, and the third internal clock signal pair INCK3/INCK3B. Based on the first internal clock signals INCK1, the second internal clock signals INCK2, and the third internal clock signal pair INCK3/INCK3B, the data path 260 may transfer, to the memory core 270, the data DQ provided from the external apparatus 110 through the data bus 140 of FIG. 1. Based on the first internal clock signals INCK1, the second internal clock signals INCK2, and the third internal clock signal pair INCK3/INCK3B, the data path 260 may transfer, to the external apparatus 110 through the data bus 140, data DQ provided from the memory core 270. In an embodiment, the data path 260 may serialize, by utilizing the first internal clock signals INCK1, the second internal clock signals INCK2 and the third internal clock signal pair INCK3/INCK3B, the data stored in the memory core 270 and may provide the serialized data to the external apparatus 110.

Figure 3A:
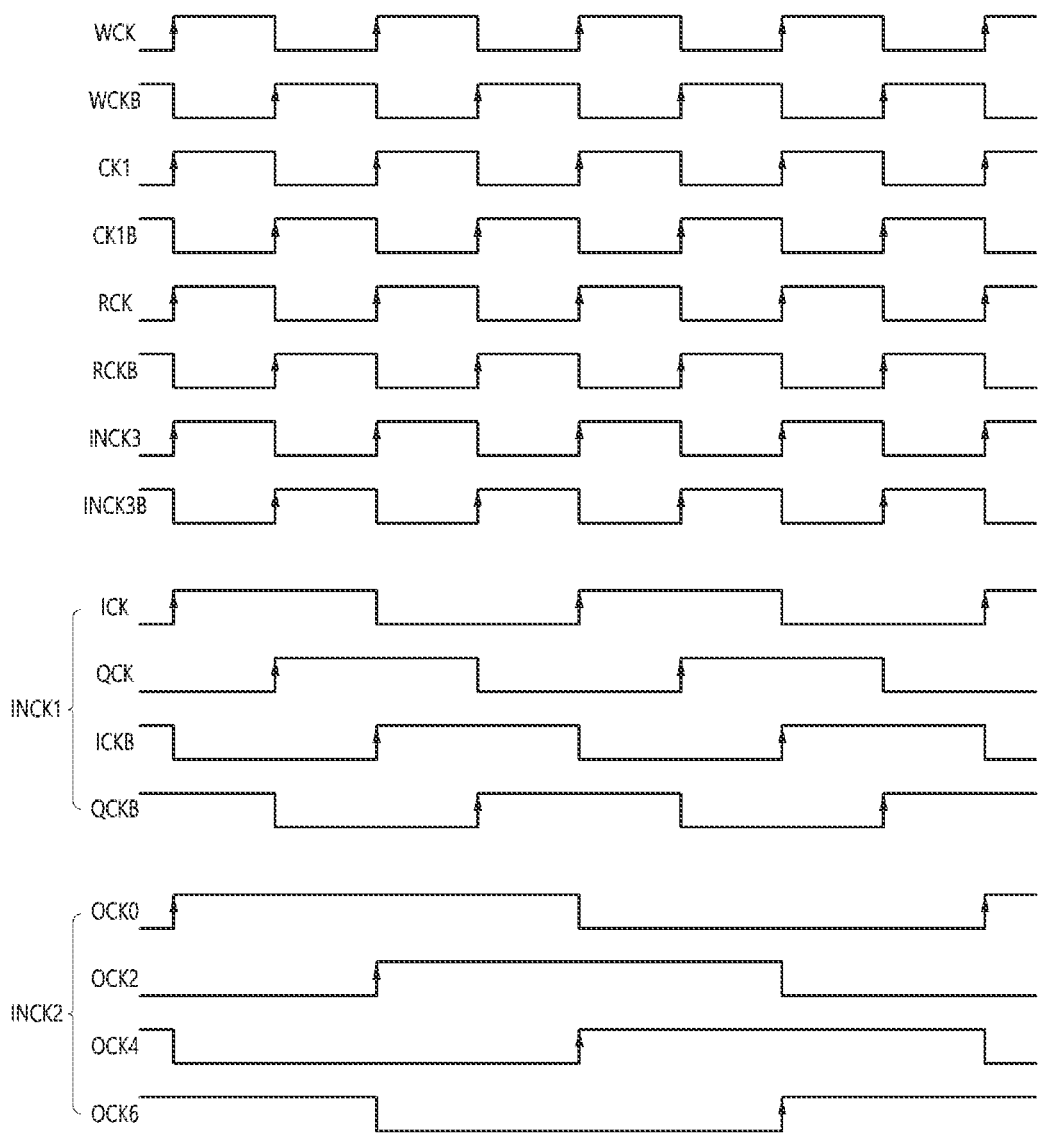
FIG. 3A is a timing diagram illustrating an operation of a semiconductor apparatus in a first operation mode in accordance with an embodiment.

FIG. 3A is a timing diagram illustrating an operation of the semiconductor apparatus 200 in accordance with an embodiment in the first operation mode. Hereinafter, described with reference to FIGS. 1, 2 and 3A will be the operation of the semiconductor apparatus 200. The external apparatus 110 may provide, through the clock bus 130, the semiconductor apparatus 200 with the system clock signal pair WCK/WCKB having a frequency within the low frequency range. The system clock signal pair WCK/WCKB may have a phase difference of 180°. When the system clock signal pair WCK/WCKB has a frequency within the low frequency range, the semiconductor apparatus 200 may operate in the first operation mode. When the semiconductor apparatus 200 operates in the first operation mode, the first clock path 210 may be activated. When the first clock path 210 is activated, the first clock path 210 may buffer the system clock signal pair WCK/WCKB to output the first clock signal pair CK1/CK1B. The first clock signal pair CK1/CK1B may have substantially the same frequency as the system clock signal pair WCK/WCKB. The first clock signal pair CK1/CK1B may have a phase difference of 180°, which is substantially the same as the system clock signal pair WCK/WCKB.

The first selecting circuit 240 may receive the first clock signal pair CK1/CK1B from the first clock path 210. In the first operation mode, the first selecting circuit 240 may output the first clock signal pair CK1/CK1B as the first reference clock signal pair RCK/RCKB. Based on the first selecting signal SEL1 in the first operation mode, the first selecting circuit 240 may select the first clock signal pair CK1/CK1B as the first reference clock signal pair RCK/RCKB. Therefore, the first reference clock signal pair RCK/RCKB may have substantially the same frequency as the first clock signal pair CK1/CK1B. The first reference clock signal pair RCK/RCKB may have a phase difference of 180°, which is substantially the same as the first clock signal pair CK1/CK1B.

The multi-phase clock generating circuit 250 may receive the first reference clock signal pair RCK/RCKB from the first selecting circuit 240. Based on the first reference clock signal pair RCK/RCKB, the multi-phase clock generating circuit 250 may generate the first internal clock signals INCK1, the second internal clock signals INCK2, and the third internal clock signal pair INCK3/INCK3B. The multi-phase clock generating circuit 250 may output the first reference clock signal pair RCK/RCKB as the third internal clock signal pair INCK3/INCK3B. Therefore, the third internal clock signal pair INCK3/INCK3B may have substantially the same frequency as the first reference clock signal pair RCK/RCKB. The third internal clock signal pair INCK3/INCK3B may have a phase difference of 180°, which is substantially the same as the first reference clock signal pair RCK/RCKB. Also, the multi-phase clock generating circuit 250 may generate the first internal clock signals INCK1 by dividing the first reference clock signal pair RCK/RCKB. The first internal clock signals INCK1 may include the plurality of first internal clock signals ICK, QCK, ICKB, and QCKB. Each of the plurality of first internal clock signals ICK, QCK, ICKB, and QCKB may have a frequency twice lower than the system clock signal pair WCK/WCKB. The plurality of first internal clock signals ICK, QCK, ICKB, and QCKB may sequentially have a phase difference of 90° between each other. Further, the multi-phase clock generating circuit 250 may generate the second internal clock signals INCK2 by dividing the first internal clock signals INCK1. The second internal clock signals INCK2 may include the plurality of second internal clock signals OCK0, OCK2, OCK4, and OCK6. Each of the plurality of second internal clock signals OCK0, OCK2, OCK4, and OCK6 may have a frequency four (4) times lower than the system clock signal pair WCK/WCKB. The plurality of second internal clock signals OCK0, OCK2, OCK4, and OCK6 may sequentially have a phase difference of 90° between each other.

Figure 3B:
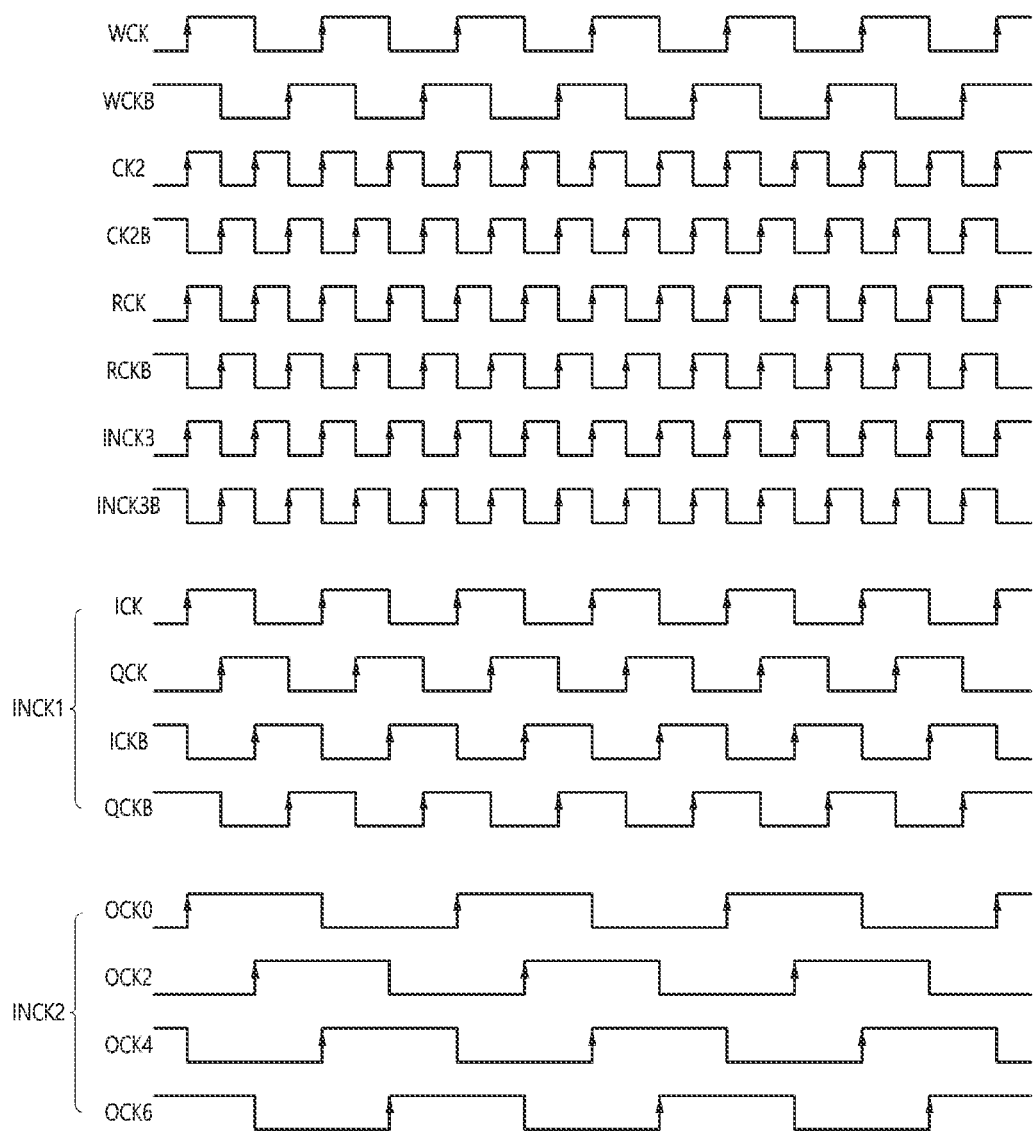
FIG. 3B is a timing diagram illustrating an operation of a semiconductor apparatus in a second operation mode in accordance with an embodiment.

FIG. 3B is a timing diagram illustrating an operation of the semiconductor apparatus 200 in the second operation mode in accordance with an embodiment. Hereinafter, described with reference to FIGS. 1, 2, and 3B will be the operation of the semiconductor apparatus 200. The external apparatus 110 may provide, through the clock bus 130, the semiconductor apparatus 200 with the system clock signal pair WCK/WCKB having a frequency within the middle frequency range. The system clock signal pair WCK/WCKB may have a phase difference of 90°. When the system clock signal pair WCK/WCKB has a frequency within the middle frequency range, the semiconductor apparatus 200 may operate in the second operation mode. When the semiconductor apparatus 200 operates in the second operation mode, the second clock path 220 may be activated. When the second clock path 220 is activated, the second clock path 220 may multiply the frequency of the system clock signal pair WCK/WCKB to generate the second clock signal pair CK2/CK2B. The second clock signal pair CK2/CK2B may have a higher frequency than the system clock signal pair WCK/WCKB. The second clock signal pair CK2/CK2B may have a phase difference of 180°. For example, when the second clock path 220 is activated, the multiplier 222 may multiply the frequency of the system clock signal pair WCK/WCKB to generate the second clock signal pair CK2/CK2B having the frequency twice higher than the system clock signal pair WCK/WCKB.

The first selecting circuit 240 may receive the second clock signal pair CK2/CK2B from the second clock path 220. In the second operation mode, the first selecting circuit 240 may output the second clock signal pair CK2/CK2B as the first reference clock signal pair RCK/RCKB. Based on the second selecting signal SEL2 in the second operation mode, the first selecting circuit 240 may select the second clock signal pair CK2/CK2B as the first reference clock signal pair RCK/RCKB. The first reference clock signal pair RCK/RCKB may have substantially the same frequency as the second clock signal pair CK2/CK2B. The first reference clock signal pair RCK/RCKB may have substantially the same phase difference as the second clock signal pair CK2/CK2B.

The multi-phase clock generating circuit 250 may receive the first reference clock signal pair RCK/RCKB from the first selecting circuit 240. Based on the first reference clock signal pair RCK/RCKB, the multi-phase clock generating circuit 250 may generate the first internal clock signals INCK1, the second internal clock signals INCK2, and the third internal clock signal pair INCK3/INCK3B. The multi-phase clock generating circuit 250 may output the first reference clock signal pair RCK/RCKB as the third internal clock signal pair INCK3/INCK3B. Therefore, the third internal clock signal pair INCK3/INCK3B may have substantially the same frequency as the first reference clock signal pair RCK/RCKB. The third internal clock signal pair INCK3/INCK3B may have a phase difference of 180°, which is substantially the same as the first reference clock signal pair RCK/RCKB. Also, the multi-phase clock generating circuit 250 may generate the first internal clock signals INCK1 by dividing the first reference clock signal pair RCK/RCKB. The first internal clock signals INCK1 may include the plurality of first internal clock signals ICK, QCK, ICKB, and QCKB. Each of the plurality of first internal clock signals ICK, QCK, ICKB, and QCKB may have a frequency twice lower than the system clock signal pair WCK/WCKB. The plurality of first internal clock signals ICK, QCK, ICKB, and QCKB may sequentially have a phase difference of 90° between each other. Further, the multi-phase clock generating circuit 250 may generate the second internal clock signals INCK2 by dividing the first internal clock signals INCK1. The second internal clock signals INCK2 may include the plurality of second internal clock signals OCK0, OCK2, OCK4, and OCK6. Each of the plurality of second internal clock signals OCK0, OCK2, OCK4, and OCK6 may have a frequency four (4) times lower than the system clock signal pair WCK/WCKB. The plurality of second internal clock signals OCK0, OCK2, OCK4, and OCK6 may sequentially have a phase difference of 90° between each other.

Figure 3C:
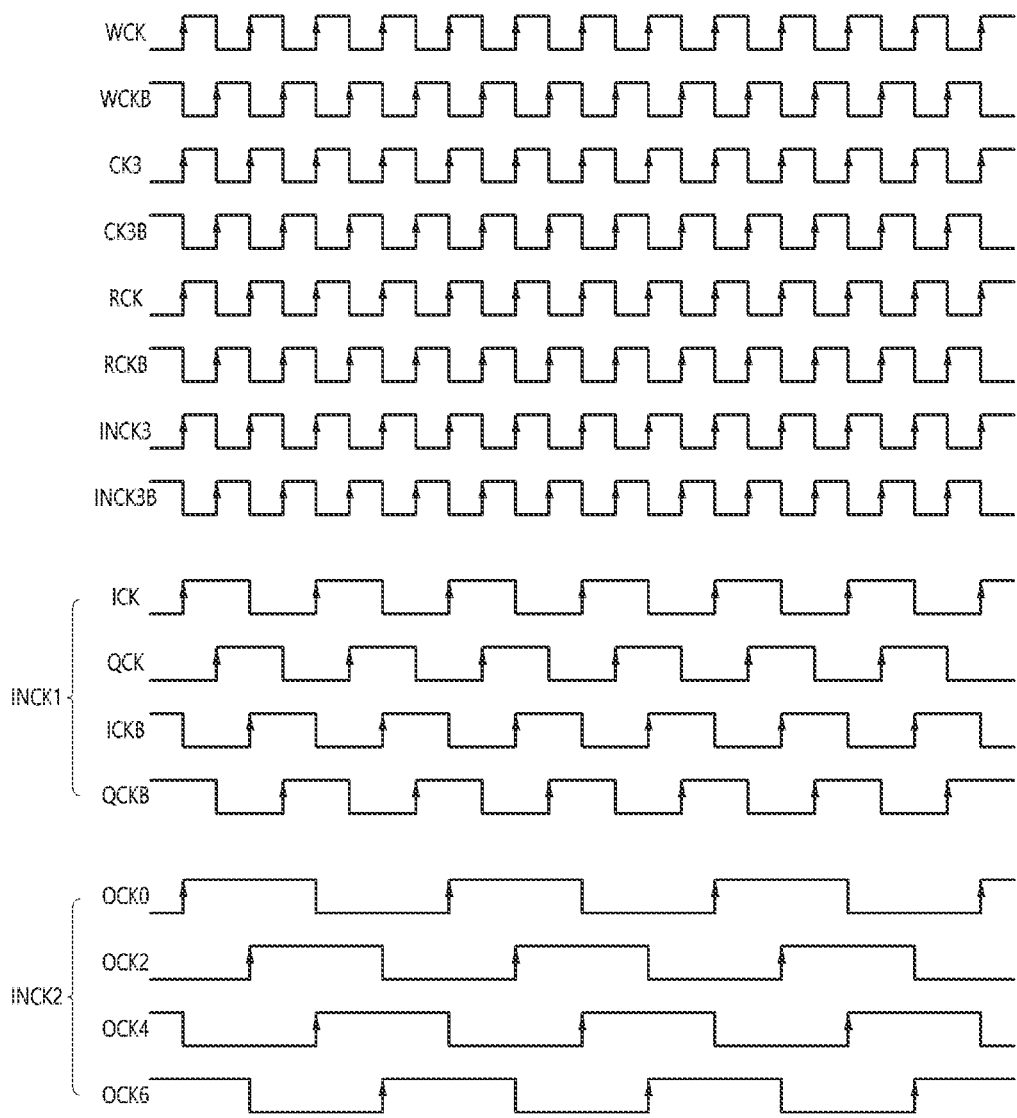
FIG. 3C is a timing diagram illustrating an operation of a semiconductor apparatus in a third operation mode in accordance with an embodiment.

FIG. 3C is a timing diagram illustrating an operation of the semiconductor apparatus 200 in the third operation mode in accordance with an embodiment. Hereinafter, described with reference to FIGS. 1, 2, and 3C will be the operation of the semiconductor apparatus 200. The external apparatus 110 may provide, through the clock bus 130, the semiconductor apparatus 200 with the system clock signal pair WCK/WCKB having a frequency within the high frequency range. The system clock signal pair WCK/WCKB may have a phase difference of 180°. When the system clock signal pair WCK/WCKB has a frequency within the high frequency range, the semiconductor apparatus 200 may operate in the third operation mode. When the semiconductor apparatus 200 operates in the third operation mode, the third clock path 230 may be activated. When the third clock path 230 is activated, the third clock path 230 may convert the level of the system clock signal pair WCK/WCKB to generate the third clock signal pair CK3/CK3B. Specifically, the third clock path 230 may convert the level of the system clock signal pair WCK/WCKB from the CML level to the CMOS level to generate the third clock signal pair CK3/CK3B. Even when the amplitude of the third clock signal pair CK3/CK3B may change, the third clock signal pair CK3/CK3B may have a phase difference of 180°, which is substantially the same as the system clock signal pair WCK/WCKB.

The first selecting circuit 240 may receive the third clock signal pair CK3/CK3B from the third clock path 230. In the third operation mode, the first selecting circuit 240 may output the third clock signal pair CK3/CK3B as the first reference clock signal pair RCK/RCKB. Based on the third selecting signal SEL3 in the third operation mode, the first selecting circuit 240 may select the third clock signal pair CK3/CK3B as the first reference clock signal pair RCK/RCKB. The first reference clock signal pair RCK/RCKB may have substantially the same frequency as the third clock signal pair CK3/CK3B. The first reference clock signal pair RCK/RCKB may have a phase difference of 180°, which is substantially the same as the third clock signal pair CK3/CK3B.

The multi-phase clock generating circuit 250 may receive the first reference clock signal pair RCK/RCKB from the first selecting circuit 240. Based on the first reference clock signal pair RCK/RCKB, the multi-phase clock generating circuit 250 may generate the first internal clock signals INCK1, the second internal clock signals INCK2, and the third internal clock signal pair INCK3/INCK3B. The multi-phase clock generating circuit 250 may output the first reference clock signal pair RCK/RCKB as the third internal clock signal pair INCK3/INCK3B. Therefore, the third internal clock signal pair INCK3/INCK3B may have substantially the same frequency as the first reference clock signal pair RCK/RCKB. The third internal clock signal pair INCK3/INCK3B may have a phase difference of 180°, which is substantially the same as the first reference clock signal pair RCK/RCKB. Also, the multi-phase clock generating circuit 250 may generate the first internal clock signals INCK1 by dividing the first reference clock signal pair RCK/RCKB. The first internal clock signals INCK1 may include the plurality of first internal clock signals ICK, QCK, ICKB, and QCKB. Each of the plurality of first internal clock signals ICK, QCK, ICKB, and QCKB may have a frequency twice lower than the system clock signal pair WCK/WCKB. The plurality of first internal clock signals ICK, QCK, ICKB, and QCKB may sequentially have a phase difference of 90° between each other. Further, the multi-phase clock generating circuit 250 may generate the second internal clock signals INCK2 by dividing the first internal clock signals INCK1. The second internal clock signals INCK2 may include the plurality of second internal clock signals OCK0, OCK2, OCK4, and OCK6. Each of the plurality of second internal clock signals OCK0, OCK2, OCK4, and OCK6 may have a frequency four (4) times lower than the system clock signal pair WCK/WCKB. The plurality of second internal clock signals OCK0, OCK2, OCK4, and OCK6 may sequentially have a phase difference of 90° between each other.

Referring to FIGS. 2, 3B, and 3C, the system clock signal pair WCK/WCKB provided in the second operation mode may have a lower frequency than the system clock signal pair WCK/WCKB provided in the third operation mode. In the second operation mode, the second clock path 220 may generate the second clock signal pair CK2/CK2B by multiplying the system clock signal pair WCK/WCKB. Therefore, the second clock path 220 may generate the second clock signal pair CK2/CK2B having substantially the same frequency as the third clock signal pair CK3/CK3B generated by the third clock path 230. The first internal clock signals INCK1, the second internal clock signals INCK2, and the third internal clock signal pair INCK3/INCK3B that are generated on the basis of the second clock signal pair CK2/CK2B in the second operation mode may have substantially the same frequency as the first internal clock signals INCK1, the second internal clock signals INCK2, and the third internal clock signal pair INCK3/INCK3B that are generated on the basis of the third clock signal pair CK3/CK3B in the third operation mode. The semiconductor apparatus 200 may generate the internal clock signals having the high frequency even when the semiconductor apparatus 200 receives, from the external apparatus 110, the system clock signal pair WCK/WCKB having the low frequency in the second operation mode. Therefore, the semiconductor apparatus 200 may operate, during the package test, at substantially the same speed as the normal operation.

Figure 4:
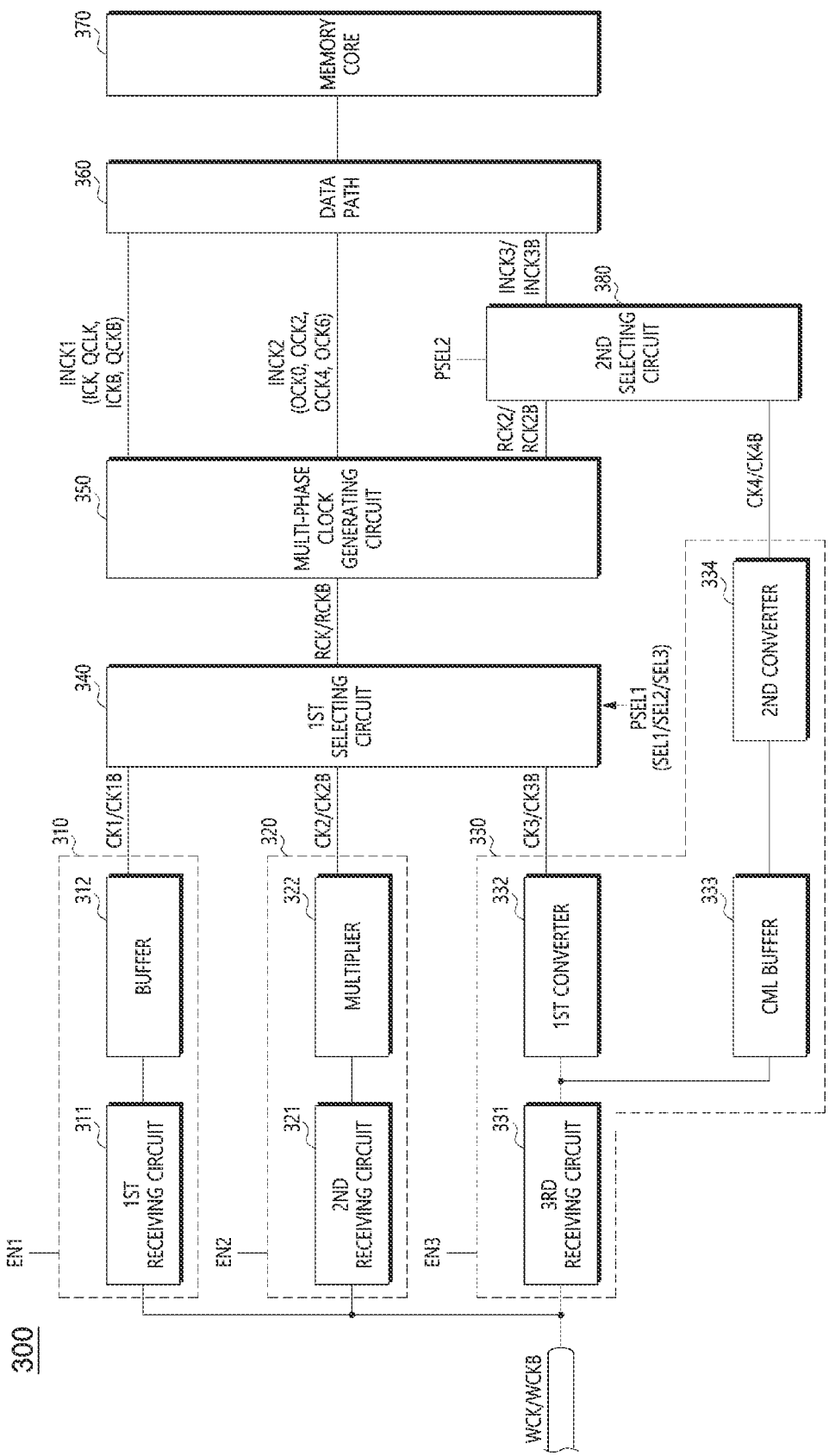
FIG. 4 is a block diagram illustrating a configuration of a semiconductor apparatus in accordance with an embodiment.

FIG. 4 is a block diagram illustrating a configuration of a semiconductor apparatus 300 in accordance with an embodiment. The semiconductor apparatus 300 may be applied as the semiconductor apparatus 120 illustrated in FIG. 1. The semiconductor apparatus 300 may determine, based on the frequency range of the system clock signal pair WCK/WCKB, an operation mode optimal for the operation of the semiconductor apparatus 300. When the system clock signal pair WCK/WCKB has a frequency within the first frequency range, the semiconductor apparatus 300 may operate in the first operation mode. When the system clock signal pair WCK/WCKB has a frequency within the second frequency range higher than the first frequency range, the semiconductor apparatus 300 may operate in the second operation mode. When the system clock signal pair WCK/WCKB has a frequency within the third frequency range higher than the second frequency range, the semiconductor apparatus 300 may operate in the third operation mode. The first to third frequency ranges may be classified respectively as the low frequency range, the middle frequency range, and the high frequency range. The classification of the frequency ranges might not be based on a particular value of the frequency. For example, when the system clock signal pair WCK/WCKB has a frequency within the low frequency range, the semiconductor apparatus 300 may operate in the first operation mode. When the system clock signal pair WCK/WCKB has a frequency within the middle frequency range, the semiconductor apparatus 300 may operate in the second operation mode. When the system clock signal pair WCK/WCKB has a frequency within the high frequency range, the semiconductor apparatus 300 may operate in the third operation mode.

The semiconductor apparatus 300 may include a plurality of clock paths. According to the operation mode, the semiconductor apparatus 300 may select one of the plurality of clock paths to operate through the selected clock path. The plurality of clock paths may include a first clock path 310, a second clock path 320, and a third clock path 330.

The first clock path 310 may be activated in the first operation mode. When the first clock path 310 is activated, the first clock path 310 may receive the system clock signal pair WCK/WCKB and may buffer the system clock signal pair WCK/WCKB to generate the first clock signal pair CK1/CK1B. The system clock signal pair WCK/WCKB may have a phase difference of 180°, and the first clock signal pair CK1/CK1B may have a phase difference of 180°. The first clock signal pair CK1/CK1B may have the same frequency as the system clock signal pair WCK/WCKB. The first clock path 310 may include a first receiving circuit 311 and a buffer 312. The first receiving circuit 311 may receive the system clock signal pair WCK/WCKB to differentially amplify the system clock signal pair WCK/WCKB. The first receiving circuit 311 may output the differentially amplified signals. The buffer 312 may buffer the output signals from the first receiving circuit 311. That is, the buffer 312 may differentially amplify the output signals to generate a first clock signal pair CK1/CK1B. The buffer 312 may be a differential amplifier configured to differentially amplify the output signals from the first receiving circuit 311.

In an embodiment, the first clock path 310 may be selectively activated according to a first activating signal EN1. For example, the first activating signal EN1 may be enabled in the first operation mode to activate the first clock path 310. The first receiving circuit 311 and the buffer 312 may be activated when the first activating signal EN1 is enabled. When the first receiving circuit 311 is activated, the first receiving circuit 311 may receive the system clock signal pair WCK/WCKB and may differentially amplify the system clock signal pair WCK/WCKB to output the differentially amplified signals. When the buffer 312 is activated, the buffer 312 may differentially amplify the output signals from the first receiving circuit 311 to generate the first clock signal pair CK1/CK1B. When the first activating signal EN1 is disabled, at least one of the first receiving circuit 311 and the buffer 312 may be deactivated. When at least one of the first receiving circuit 311 and the buffer 312 is deactivated, the first clock path 310 might not receive the system clock signal pair WCK/WCKB and might not generate the first clock signal pair CK1/CK1B.

The second clock path 320 may be activated in the second operation mode. When the second clock path 320 is activated, the second clock path 320 may receive the system clock signal pair WCK/WCKB and may multiply the frequency of the system clock signal pair WCK/WCKB to generate a second clock signal pair CK2/CK2B. The system clock signal pair WCK/WCKB may have a phase difference of 90° and the second clock signal pair CK2/CK2B may have a phase difference of 180°. The second clock signal pair CK2/CK2B may have a higher frequency than the system clock signal pair WCK/WCKB. For example, the second clock signal pair CK2/CK2B may have a frequency twice higher than the system clock signal pair WCK/WCKB. The second clock path 320 may include a second receiving circuit 321 and a multiplier 322. The second receiving circuit 321 may receive the system clock signal pair WCK/WCKB to differentially amplify the system clock signal pair WCK/WCKB. The second receiving circuit 321 may output the differentially amplified signals. The multiplier 322 may multiply the frequency of the output signals from the second receiving circuit 321 to generate the second clock signal pair CK2/CK2B. For example, the multiplier 322 may multiply the frequency of the output signals from the second receiving circuit 321 to generate the second clock signal pair CK2/CK2B having the frequency twice higher than the system clock signal pair WCK/WCKB.

In an embodiment, the second clock path 320 may be selectively activated according to a second activating signal EN2. For example, the second activating signal EN2 may be enabled in the second operation mode to activate the second clock path 320. The second receiving circuit 321 and the multiplier 322 may be activated when the second activating signal EN2 is enabled. When the second receiving circuit 321 is activated, the second receiving circuit 321 may receive the system clock signal pair WCK/WCKB and may differentially amplify the system clock signal pair WCK/WCKB to output the differentially amplified signals. When the multiplier 322 is activated, the multiplier 322 may multiply the frequency of the output signals from the second receiving circuit 321 to generate the second clock signal pair CK2/CK2B. When the second activating signal EN2 is disabled, at least one of the second receiving circuit 321 and the multiplier 322 may be deactivated. When at least one of the second receiving circuit 321 and the multiplier 322 is deactivated, the second clock path 320 might not receive the system clock signal pair WCK/WCKB and might not generate the second clock signal pair CK2/CK2B.

The third clock path 330 may be activated in the third operation mode. When the third clock path 330 is activated, the third clock path 330 may receive the system clock signal pair WCK/WCKB and may convert the level of the system clock signal pair WCK/WCKB to generate a third clock signal pair CK3/CK3B. The third clock path 330 may buffer the system clock signal pair WCK/WCKB to the CML level and then may generate a fourth clock signal pair CK4/CK4B. Each of the third clock signal pair CK3/CK3B and the fourth clock signal pair CK4/CK4B may be a signal converted from the CML level to the CMOS level. The system clock signal pair WCK/WCKB may have a phase difference of 180°. The third clock signal pair CK3/CK3B may have a phase difference of 180°. The fourth clock signal pair CK4/CK4B may have a phase difference of 180°. In an embodiment, each of the third clock signal pair CK3/CK3B and the fourth clock signal pair CK4/CK4B may have substantially the same frequency as the system clock signal pair WCK/WCKB.

The third clock path 330 may include a third receiving circuit 331, a first converter 332, a CML buffer 333 and a second converter 334. The third receiving circuit 331 may receive the system clock signal pair WCK/WCKB to differentially amplify the system clock signal pair WCK/WCKB. The third receiving circuit 331 may output the differentially amplified signals. The first converter 332 may convert the level of the output signals from the third receiving circuit 331 to generate the third clock signal pair CK3/CK3B. The CML buffer 333 may buffer the output signals from the third receiving circuit 331, the output signals having the CML level. Then, the third receiving circuit 331 may output the buffered signals having the CML level. The second converter 334 may convert the level of the output signals from the CML buffer 333 to generate the fourth clock signal pair CK4/CK4B. For example, each of the first converter 332 and the second converter 334 may convert, from the CML level to the CMOS level, the level of the system clock signal pair WCK/WCKB.

The levels of the third clock signal pair CK3/CK3B and the fourth clock signal pair CK4/CK4B may be converted from the CML level to the CMOS level through the first converter 332 and the second converter 334, respectively. Ideally, the system clock signal pair WCK/WCKB, the third clock signal pair CK3/CK3B and the fourth clock signal pair CK4/CK4B may have substantially the same frequency and substantially the same phase. However, the third clock signal pair CK3/CK3B may be generated by directly converting the output signals from the third receiving circuit 331 the CMOS level. On the other hand, the fourth clock signal pair CK4/CK4B may be converted to the CMOS level by the second converter 334 after the output signals from the third receiving circuit 331 and having the CML level are additionally buffered by the CML buffer 333. Therefore, the fourth clock signal pair CK4/CK4B may have better signal characteristics than the third clock signal pair CK3/CK3B although the third clock signal pair CK3/CK3B and the fourth clock signal pair CK4/CK4B may have substantially the same frequency and substantially the same phase.

In an embodiment, the third clock path 330 may be selectively activated according to a third activating signal EN3. For example, the third activating signal EN3 may be enabled in the third operation mode to activate the third clock path 330. The third receiving circuit 331, the first converter 332, the CML buffer 333, and the second converter 334 may be activated when the third activating signal EN3 is enabled. When the third receiving circuit 331 is activated, the third receiving circuit 331 may receive the system clock signal pair WCK/WCKB and may differentially amplify the system clock signal pair WCK/WCKB to output the differentially amplified signals. When the first converter 332 is activated, the first converter 332 may convert, from the CML level to the CMOS level, the level of the output signals from the third receiving circuit 331 to generate the third clock signal pair CK3/CK3B. When the CML buffer 333 is activated, the CML buffer 333 may buffer the output signals from the third receiving circuit 331 to output the buffered signals. When the second converter 334 is activated, the second converter 334 may convert, from the CML level to the CMOS level, the level of the output signals from the CML buffer 333 to generate the fourth clock signal pair CK4/CK4B. When the third activating signal EN3 is disabled, the third receiving circuit 331, the first converter 332, the CML buffer 333, and the second converter 334 may selectively be deactivated. In an embodiment, when the third clock path 330 is deactivated, the third clock path 330 might not receive the system clock signal pair WCK/WCKB and might not generate the third clock signal pair CK3/CK3B or the fourth clock signal pair CK4/CK4B.

The semiconductor apparatus 300 may further include a first selecting circuit 340, a multi-phase clock generating circuit 350, and a second selecting circuit 380. According to the operation mode, the first selecting circuit 340 may selectively output, as a first reference clock signal pair RCK/RCKB, one of the first clock signal pair CK1/CK1B, the second clock signal pair CK2/CK2B and the third clock signal pair CK3/CK3B. The first selecting circuit 340 may receive a first path selecting signal PSEL1. Based on the first path selecting signal PSEL1, the first selecting circuit 340 may output, as the first reference clock signal pair RCK/RCKB, one of the first clock signal pair CK1/CK1B, the second clock signal pair CK2/CK2B and the third clock signal pair CK3/CK3B. The first path selecting signal PSEL1 may be a signal indicating one of the first to third operation modes. For example, the first path selecting signal PSEL1 may be any of a first selecting signal SEL1, a second selecting signal SEL2 and a third selecting signal SEL3.

The first path selecting signals PSEL1 may be generated from a control signal from the external apparatus 110 of FIG. 1 or may be generated according to a result of detecting, by the semiconductor apparatus 300, the frequency of the system clock signal pair WCK/WCKB. In an embodiment, the first path selecting signals PSEL1 may include a plurality of bits and the first path selecting signals PSEL1 may be any of the first to third selecting signals SEL1, SEL2, and SEL3 through the change of logic levels of the plural bits. Based on the indication of one of the first to third selecting signals SEL1, SEL2, and SEL3 according to the change of logic levels of the plural bits within the first path selecting signals PSEL1, the indicated one of the first to third selecting signals SEL1, SEL2, and SEL3 may be enabled. For example, the first selecting signal SEL1 may be enabled in the first operation mode to select the first clock path 310, the second selecting signal SEL2 may be enabled in the second operation mode to select the second clock path 320, and the third selecting signal SEL3 may be enabled in the third operation mode to select the third clock path 330.

In an embodiment, when the first selecting signal SEL1 is enabled, the first selecting circuit 340 may output, as the first reference clock signal pair RCK/RCKB, the first clock signal pair CK1/CK1B from the first clock path 310. In an embodiment, when the second selecting signal SEL2 is enabled, the first selecting circuit 340 may output, as the first reference clock signal pair RCK/RCKB, the second clock signal pair CK2/CK2B from the second clock path 320. In an embodiment, when the third selecting signal SEL3 is enabled, the first selecting circuit 340 may output, as the first reference clock signal pair RCK/RCKB, the third clock signal pair CK3/CK3B from the third clock path 330.

Based on the first reference clock signal pair RCK/RCKB, the multi-phase clock generating circuit 350 may generate first internal clock signals INCK1, second internal clock signals INCK2, and a second reference clock signal pair RCK2/RCK2B.

For example, the multi-phase clock generating circuit 350 may output the first reference clock signal pair RCK/RCKB as the second reference clock signal pair RCK2/RCK2B. The first reference clock signal pair RCK/RCKB may have a phase difference of 180°. The second reference clock signal pair RCK2/RCK2B may have substantially the same phase difference and substantially the same frequency as the first reference clock signal pair RCK/RCKB. Also, the multi-phase clock generating circuit 350 may generate the first internal clock signals INCK1 by dividing the first reference clock signal pair RCK/RCKB. The first internal clock signals INCK1 may include a plurality of internal clock signals. Further, the multi-phase clock generating circuit 350 may generate the second internal clock signals INCK2 by dividing the first internal clock signals INCK1. The second internal clock signals INCK2 may include a plurality of internal clock signals. The first internal clock signals INCK1 may include an internal clock signal ICK, an internal clock signal QCK, an internal clock signal ICKB, and an internal clock signal QCKB. The second internal clock signals INCK2 may include an internal clock signal OCK0, an internal clock signal OCK2, an internal clock signal OCK4, and an internal clock signal OCK6. In an embodiment, the first selecting circuit 340 may be integrated into the multi-phase clock generating circuit 350 to be an element within the multi-phase clock generating circuit 350.

The second selecting circuit 380 may select one of the second reference clock signal pair RCK2/RCK2B and the fourth clock signal pair CK4/CK4B to output the selected pair as a third internal clock signal pair INCK3/INCK3B. The second selecting circuit 380 may receive the second reference clock signal pair RCK2/RCK2B from the multi-phase clock generating circuit 350, may receive the fourth clock signal pair CK4/CK4B from the third clock path 330 and may output, as the third internal clock signal pair INCK3/INCK3B, a selected one of the second reference clock signal pair RCK2/RCK2B and the fourth clock signal pair CK4/CK4B. The second selecting circuit 380 may receive a second path selecting signal PSEL2. Based on the second path selecting signal PSEL2, the second selecting circuit 380 may output, as the third internal clock signal pair INCK3/INCK3B, at least one of the second reference clock signal pair RCK2/RCK2B and the fourth clock signal pair CK4/CK4B. For example, when the second path selecting signal PSEL2 is enabled, the second selecting circuit 380 may output, as the third internal clock signal pair INCK3/INCK3B, the second reference clock signal pair RCK2/RCK2B from the multi-phase clock generating circuit 350. For example, when the second path selecting signal PSEL2 is disabled, the second selecting circuit 380 may output, as the third internal clock signal pair INCK3/INCK3B, the fourth clock signal pair CK4/CK4B from the third clock path 330. In an embodiment, when the second path selecting signal PSEL2 is disabled, the second selecting circuit 380 may output, as the third internal clock signal pair INCK3/INCK3B, the second reference clock signal pair RCK2/RCK2B from the multi-phase clock generating circuit 350. In an embodiment, when the second path selecting signal PSEL2 is enabled, the second selecting circuit 380 may output, as the third internal clock signal pair INCK3/INCK3B, the fourth clock signal pair CK4/CK4B from the third clock path 330. The second path selecting signal PSEL2 may be generated from a control signal from the external apparatus 110 of FIG. 1 or may be generated according to a result of detecting, by the semiconductor apparatus 300, the frequency of the system clock signal pair WCK/WCKB. In an embodiment, the second path selecting signal PSEL2 may include a plurality of bits and may be enabled or disabled according to the change of logic levels of the plural bits.

The semiconductor apparatus 300 may further include a data path 360 and a memory core 370. The data path 360 may receive the first internal clock signals INCK1, the second internal clock signals INCK2, and the third internal clock signal pair INCK3/INCK3B. Based on the first internal clock signals INCK1, the second internal clock signals INCK2, and the third internal clock signal pair INCK3/INCK3B, the data path 360 may transfer, to the memory core 370, the data DQ provided from the external apparatus 110 through the data bus 140 of FIG. 1. Based on the first internal clock signals INCK1, the second internal clock signals INCK2, and the third internal clock signal pair INCK3/INCK3B, the data path 360 may transfer, to the external apparatus 110 through the data bus 140, data DQ provided from the memory core 370. In an embodiment, the data path 360 may serialize, by utilizing the first internal clock signals INCK1, the second internal clock signals INCK2, and the third internal clock signal pair INCK3/INCK3B, the data output from the memory core 370 and may provide the serialized data to the external apparatus 110.

Figure 5:
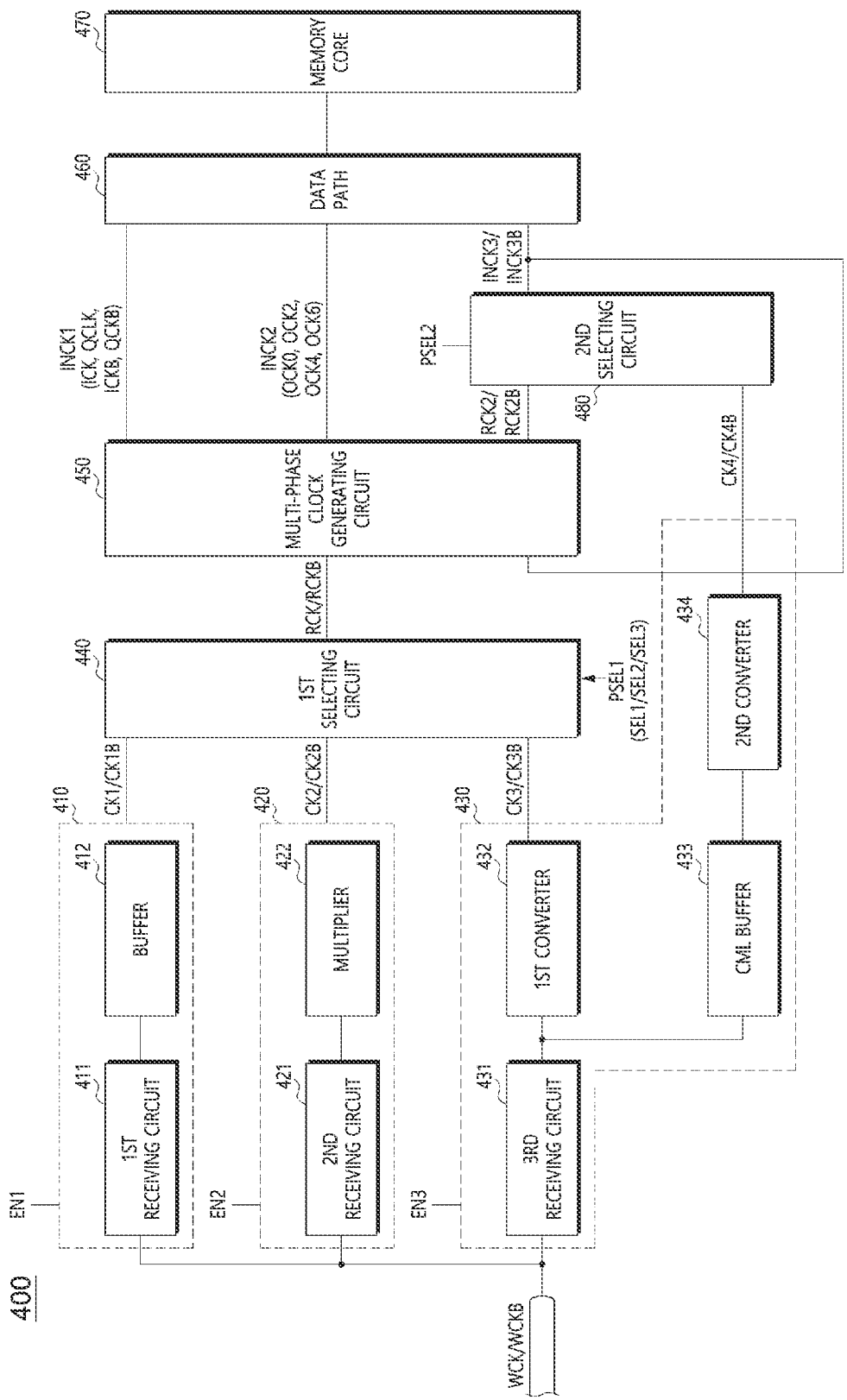
FIG. 5 is a block diagram illustrating a configuration of a semiconductor apparatus in accordance with an embodiment.

FIG. 5 is a block diagram illustrating a configuration of a semiconductor apparatus 400 in accordance with an embodiment. The semiconductor apparatus 400 may be applied as the semiconductor apparatus 120 illustrated in FIG. 1. The semiconductor apparatus 400 may determine, based on the frequency range of the system clock signal pair WCK/WCKB, an operation mode optimal for the operation of the semiconductor apparatus 400. When the system clock signal pair WCK/WCKB has a frequency within the first frequency range, the semiconductor apparatus 400 may operate in the first operation mode. When the system clock signal pair WCK/WCKB has a frequency within the second frequency range higher than the first frequency range, the semiconductor apparatus 400 may operate in the second operation mode. When the system clock signal pair WCK/WCKB has a frequency within the third frequency range higher than the second frequency range, the semiconductor apparatus 400 may operate in the third operation mode. The first to third frequency ranges may be classified respectively as the low frequency range, the middle frequency range, and the high frequency range. The classification of the frequency ranges might not be based on a particular value of the frequency.

For example, when the system clock signal pair WCK/WCKB has a frequency within the low frequency range, the semiconductor apparatus 400 may operate in the first operation mode. When the system clock signal pair WCK/WCKB has a frequency within the middle frequency range, the semiconductor apparatus 400 may operate in the second operation mode. When the system clock signal pair WCK/WCKB has a frequency within the high frequency range, the semiconductor apparatus 400 may operate in the third operation mode.

The semiconductor apparatus 400 may include a plurality of clock paths. According to the operation mode, the semiconductor apparatus 400 may select one of the plurality of clock paths to operate through the selected clock path. The plurality of clock paths may include a first clock path 410, a second clock path 420, and a third clock path 430.

The first clock path 410 may be activated in the first operation mode. When the first clock path 410 is activated, the first clock path 410 may receive the system clock signal pair WCK/WCKB and may buffer the system clock signal pair WCK/WCKB to generate the first clock signal pair CK1/CK1B. The system clock signal pair WCK/WCKB may have a phase difference of 180°, and the first clock signal pair CK1/CK1B may have a phase difference of 180°. The first clock signal pair CK1/CK1B may have the same frequency as the system clock signal pair WCK/WCKB. The first clock path 410 may include a first receiving circuit 411 and a buffer 412. The first receiving circuit 411 may receive the system clock signal pair WCK/WCKB to differentially amplify the system clock signal pair WCK/WCKB. The first receiving circuit 411 may output the differentially amplified signals. The buffer 412 may buffer the output signals from the first receiving circuit 411. That is, the buffer 412 may differentially amplify the output signals to generate a first clock signal pair CK1/CK1B. The buffer 412 may be a differential amplifier configured to differentially amplify the output signals from the first receiving circuit 411.

In an embodiment, the first clock path 410 may be selectively activated according to a first activating signal EN1. For example, the first activating signal EN1 may be enabled in the first operation mode to activate the first clock path 410. The first receiving circuit 411 and the buffer 412 may be activated when the first activating signal EN1 is enabled. When the first receiving circuit 411 is activated, the first receiving circuit 411 may receive the system clock signal pair WCK/WCKB and may differentially amplify the system clock signal pair WCK/WCKB to output the differentially amplified signals. When the buffer 412 is activated, the buffer 412 may differentially amplify the output signals from the first receiving circuit 411 to generate the first clock signal pair CK1/CK1B. When the first activating signal EN1 is disabled, at least one of the first receiving circuit 411 and the buffer 412 may be deactivated. When at least one of the first receiving circuit 411 and the buffer 412 is deactivated, the first clock path 410 might not receive the system clock signal pair WCK/WCKB and might not generate the first clock signal pair CK1/CK1B.

The second clock path 420 may be activated in the second operation mode. When the second clock path 420 is activated, the second clock path 420 may receive the system clock signal pair WCK/WCKB and may multiply the frequency of the system clock signal pair WCK/WCKB to generate a second clock signal pair CK2/CK2B. The system clock signal pair WCK/WCKB may have a phase difference of 90° and the second clock signal pair CK2/CK2B may have a phase difference of 180°. The second clock signal pair CK2/CK2B may have a higher frequency than the system clock signal pair WCK/WCKB. For example, the second clock signal pair CK2/CK2B may have a frequency twice higher than the system clock signal pair WCK/WCKB. The second clock path 420 may include a second receiving circuit 421 and a multiplier 422. The second receiving circuit 421 may receive the system clock signal pair WCK/WCKB to differentially amplify the system clock signal pair WCK/WCKB. The second receiving circuit 421 may output the differentially amplified signals. The multiplier 422 may multiply the frequency of the output signals from the second receiving circuit 421 to generate the second clock signal pair CK2/CK2B. For example, the multiplier 422 may multiply the frequency of the output signals from the second receiving circuit 421 to generate the second clock signal pair CK2/CK2B having the frequency twice higher than the system clock signal pair WCK/WCKB.

In an embodiment, the second clock path 420 may be selectively activated according to a second activating signal EN2. For example, the second activating signal EN2 may be enabled in the second operation mode to activate the second clock path 420. The second receiving circuit 421 and the multiplier 422 may be activated when the second activating signal EN2 is enabled. When the second receiving circuit 421 is activated, the second receiving circuit 421 may receive the system clock signal pair WCK/WCKB and may differentially amplify the system clock signal pair WCK/WCKB to output the differentially amplified signals. When the multiplier 422 is activated, the multiplier 422 may multiply the frequency of the output signals from the second receiving circuit 421 to generate the second clock signal pair CK2/CK2B. When the second activating signal EN2 is disabled, at least one of the second receiving circuit 421 and the multiplier 422 may be deactivated. When at least one of the second receiving circuit 421 and the multiplier 422 is deactivated, the second clock path 420 might not receive the system clock signal pair WCK/WCKB and might not generate the second clock signal pair CK2/CK2B.

The third clock path 430 may be activated in the third operation mode. When the third clock path 430 is activated, the third clock path 430 may receive the system clock signal pair WCK/WCKB and may convert the level of the system clock signal pair WCK/WCKB to generate a third clock signal pair CK3/CK3B. The third clock path 430 may buffer the system clock signal pair WCK/WCKB having the CML level and then may convert the level of the system clock signal pair WCK/WCKB to generate a fourth clock signal pair CK4/CK4B. Each of the third clock signal pair CK3/CK3B and the fourth clock signal pair CK4/CK4B may be a signal converted from the CML level to the CMOS level. The system clock signal pair WCK/WCKB may have a phase difference of 180°. The third clock signal pair CK3/CK3B may have a phase difference of 180°. The fourth clock signal pair CK4/CK4B may have a phase difference of 180°. In an embodiment, each of the third clock signal pair CK3/CK3B and the fourth clock signal pair CK4/CK4B may have substantially the same frequency as the system clock signal pair WCK/WCKB.

The third clock path 430 may include a third receiving circuit 431, a first converter 432, a CML buffer 433, and a second converter 434. The third receiving circuit 431 may receive the system clock signal pair WCK/WCKB to differentially amplify the system clock signal pair WCK/WCKB. The third receiving circuit 431 may output the differentially amplified signals. The first converter 432 may convert the level of the output signals from the third receiving circuit 431 to generate the third clock signal pair CK3/CK3B. The CML buffer 433 may buffer the output signals from the third receiving circuit 431, the output signals having the CML level. Then, the third receiving circuit 431 may output the buffered signals having the CML level. The second converter 434 may convert the level of the output signals from the CML buffer 433 to generate the fourth clock signal pair CK4/CK4B. For example, each of the first converter 432 and the second converter 434 may convert, from the CML level to the CMOS level, the level of the system clock signal pair WCK/WCKB. The CML level may correspond to a less swing width than the CMOS level, which corresponds to a full swing width. The CMOS level may correspond to a greater swing width than the CML level.

The levels of the third clock signal pair CK3/CK3B and the fourth clock signal pair CK4/CK4B may be converted from the CML level to the CMOS level through the first converter 432 and the second converter 434, respectively. Ideally, the system clock signal pair WCK/WCKB, the third clock signal pair CK3/CK3B and the fourth clock signal pair CK4/CK4B may have substantially the same frequency and substantially the same phase. However, the third clock signal pair CK3/CK3B may be generated by directly converting the output signals from the third receiving circuit 431 to the CMOS level. On the other hand, the fourth clock signal pair CK4/CK4B may be converted to the CML level by the second converter 434 after the output signals from the third receiving circuit 431 are buffered to the CML level by the CML buffer 433. Therefore, the fourth clock signal pair CK4/CK4B may have better signal characteristics than the third clock signal pair CK3/CK3B although the third clock signal pair CK3/CK3B and the fourth clock signal pair CK4/CK4B may have substantially the same frequency and substantially the same phase.

In an embodiment, the third clock path 430 may be selectively activated according to a third activating signal EN3. For example, the third activating signal EN3 may be enabled in the third operation mode to activate the third clock path 430. The third receiving circuit 431, the first converter 432, the CML buffer 433, and the second converter 434 may be activated when the third activating signal EN3 is enabled. When the third receiving circuit 431 is activated, the third receiving circuit 431 may receive the system clock signal pair WCK/WCKB and may differentially amplify the system clock signal pair WCK/WCKB to output the differentially amplified signals. When the first converter 432 is activated, the first converter 432 may convert, from the CML level to the CMOS level, the level of the output signals from the third receiving circuit 431 to generate the third clock signal pair CK3/CK3B. When the CML buffer 433 is activated, the CML buffer 433 may buffer the output signals from the third receiving circuit 431 to output the buffered signals. When the second converter 434 is activated, the second converter 434 may convert, from the CML level to the CMOS level, the level of the output signals from the CML buffer 433 to generate the fourth clock signal pair CK4/CK4B. When the third activating signal EN3 is disabled, the third receiving circuit 431, the first converter 432, the CML buffer 433, and the second converter 434 may selectively be deactivated. In an embodiment, when the third clock path 430 is deactivated, the third clock path 430 might not receive the system clock signal pair WCK/WCKB and might not generate the third clock signal pair CK3/CK3B or the fourth clock signal pair CK4/CK4B.

The semiconductor apparatus 400 may further include a first selecting circuit 440, a multi-phase clock generating circuit 450, and a second selecting circuit 480. According to the operation mode, the first selecting circuit 440 may selectively output, as a first reference clock signal pair RCK/RCKB, one of the first clock signal pair CK1/CK1B, the second clock signal pair CK2/CK2B, and the third clock signal pair CK3/CK3B. The first selecting circuit 440 may receive a first path selecting signal PSEL1. Based on the first path selecting signal PSEL1, the first selecting circuit 440 may select one of the first clock signal pair CK1/CK1B, the second clock signal pair CK2/CK2B, and the third clock signal pair CK3/CK3B. The first path selecting signal PSEL1 may be a signal indicating one of the first to third operation modes. For example, the first path selecting signal PSEL1 may be any of a first selecting signal SEL1, a second selecting signal SEL2, and a third selecting signal SEL3.

The first path selecting signals PSEL1 may be generated from a control signal from the external apparatus 110 of FIG. 1 or may be generated according to a result of detecting, by the semiconductor apparatus 400, the frequency of the system clock signal pair WCK/WCKB. In an embodiment, the first path selecting signals PSEL1 may include a plurality of bits, and the first path selecting signals PSEL1 may be any of the first to third selecting signals SEL1, SEL2, and SEL3 through the change of logic levels of the plural bits. Based on the indication of one of the first to third selecting signals SEL1, SEL2, and SEL3 according to the change of logic levels of the plural bits within the first path selecting signals PSEL1, the indicated one of the first to third selecting signals SEL1, SEL2, and SEL3 may be enabled. For example, the first selecting signal SEL1 may be enabled in the first operation mode to select the first clock path 410, the second selecting signal SEL2 may be enabled in the second operation mode to select the second clock path 420, and the third selecting signal SEL3 may be enabled in the third operation mode to select the third clock path 430.

In an embodiment, when the first selecting signal SEL1 is enabled, the first selecting circuit 440 may output, as the first reference clock signal pair RCK/RCKB, the first clock signal pair CK1/CK1B from the first clock path 410. In an embodiment, when the second selecting signal SEL2 is enabled, the first selecting circuit 440 may output, as the first reference clock signal pair RCK/RCKB, the second clock signal pair CK2/CK2B from the second clock path 420. In an embodiment, when the third selecting signal SEL3 is enabled, the first selecting circuit 440 may output, as the first reference clock signal pair RCK/RCKB, the third clock signal pair CK3/CK3B from the third clock path 430.

The multi-phase clock generating circuit 450 may receive the first reference clock signal pair RCK/RCKB from the first selecting circuit 440 and may receive the third internal clock signal pair INCK3/INCK3B from the second selecting circuit 480. The multi-phase clock generating circuit 450 may output, as a second reference clock signal pair RCK2/RCK2B, at least one of the first reference clock signal pair RCK/RCKB and the third internal clock signal pair INCK3/INCK3B. The first reference clock signal pair RCK/RCKB and the second reference clock signal pair RCK2/RCK2B may have substantially the same phase difference and substantially the same frequency. The third internal clock signal pair INCK3/INCK3B and the second reference clock signal pair RCK2/RCK2B may have substantially the same phase difference and substantially the same frequency.

Also, the multi-phase clock generating circuit 450 may generate the first internal clock signals INCK1 by dividing at least one of the first reference clock signal pair RCK/RCKB and the third internal clock signal pair INCK3/INCK3B. The first internal clock signals INCK1 may include a plurality of internal clock signals. Further, the multi-phase clock generating circuit 450 may generate the second internal clock signals INCK2 by dividing the first internal clock signals INCK1. The second internal clock signals INCK2 may include a plurality of internal clock signals. The first internal clock signals INCK1 may include an internal clock signal ICK, an internal clock signal QCK, an internal clock signal ICKB, and an internal clock signal QCKB. The second internal clock signals INCK2 may include an internal clock signal OCK0, an internal clock signal OCK2, an internal clock signal OCK4, and an internal clock signal OCK6. In an embodiment, the first selecting circuit 440 may be integrated into the multi-phase clock generating circuit 450 to be an element within the multi-phase clock generating circuit 450.

The second selecting circuit 480 may output, as the third internal clock signal pair INCK3/INCK3B, one of the second reference clock signal pair RCK2/RCK2B and the fourth clock signal pair CK4/CK4B. The second selecting circuit 480 may receive the second reference clock signal pair RCK2/RCK2B from the multi-phase clock generating circuit 450, may receive the fourth clock signal pair CK4/CK4B from the third clock path 430 and may output, as the third internal clock signal pair INCK3/INCK3B, a selected one of the second reference clock signal pair RCK2/RCK2B and the fourth clock signal pair CK4/CK4B. The second selecting circuit 480 may receive a second path selecting signal PSEL2. Based on the second path selecting signal PSEL2, the second selecting circuit 480 may output, as the third internal clock signal pair INCK3/INCK3B, at least one of the second reference clock signal pair RCK2/RCK2B and the fourth clock signal pair CK4/CK4B. For example, when the second path selecting signal PSEL2 is enabled, the second selecting circuit 480 may output, as the third internal clock signal pair INCK3/INCK3B, the second reference clock signal pair RCK2/RCK2B from the multi-phase clock generating circuit 450. For example, when the second path selecting signal PSEL2 is disabled, the second selecting circuit 480 may output, as the third internal clock signal pair INCK3/INCK3B, the fourth clock signal pair CK4/CK4B from the third clock path 430. In an embodiment, when the second path selecting signal PSEL2 is disabled, the second selecting circuit 480 may output, as the third internal clock signal pair INCK3/INCK3B, the second reference clock signal pair RCK2/RCK2B from the multi-phase clock generating circuit 450. In an embodiment, when the second path selecting signal PSEL2 is enabled, the second selecting circuit 480 may output, as the third internal clock signal pair INCK3/INCK3B, the fourth clock signal pair CK4/CK4B from the third clock path 430. The second path selecting signal PSEL2 may be generated from a control signal from the external apparatus 110 of FIG. 1 or may be generated according to a result of detecting, by the semiconductor apparatus 400, the frequency of the system clock signal pair WCK/WCKB. In an embodiment, the second path selecting signal PSEL2 may include a plurality of bits and may be enabled or disabled according to the change of logic levels of the plural bits.

The multi-phase clock generating circuit 450 may receive the first reference clock signal pair RCK/RCKB from the first selecting circuit 440 and may receive the third internal clock signal pair INCK3/INCK3B from the second selecting circuit 480. The multi-phase clock generating circuit 450 may output, as a second reference clock signal pair RCK2/RCK2B, at least one of the first reference clock signal pair RCK/RCKB and the third internal clock signal pair INCK3/INCK3B. The first reference clock signal pair RCK/RCKB and the second reference clock signal pair RCK2/RCK2B may have substantially the same phase difference and substantially the same frequency. The third internal clock signal pair INCK3/INCK3B and the second reference clock signal pair RCK2/RCK2B may have substantially the same phase difference and substantially the same frequency.

The semiconductor apparatus 400 may further include a data path 460 and a memory core 470. The data path 460 may receive the first internal clock signals INCK1, the second internal clock signals INCK2 and the third internal clock signal pair INCK3/INCK3B. Based on the first internal clock signals INCK1, the second internal clock signals INCK2 and the third internal clock signal pair INCK3/INCK3B, the data path 460 may transfer, to the memory core 470, the data DQ provided from the external apparatus 110 through the data bus 140 of FIG. 1. Based on the first internal clock signals INCK1, the second internal clock signals INCK2 and the third internal clock signal pair INCK3/INCK3B, the data path 460 may transfer, to the external apparatus 110 through the data bus 140, data DQ provided from the memory core 470. In an embodiment, the data path 460 may serialize, by utilizing the first internal clock signals INCK1, the second internal clock signals INCK2, and the third internal clock signal pair INCK3/INCK3B, the data output from the memory core 470 and may provide the serialized data to the external apparatus 110.

Figure 6:
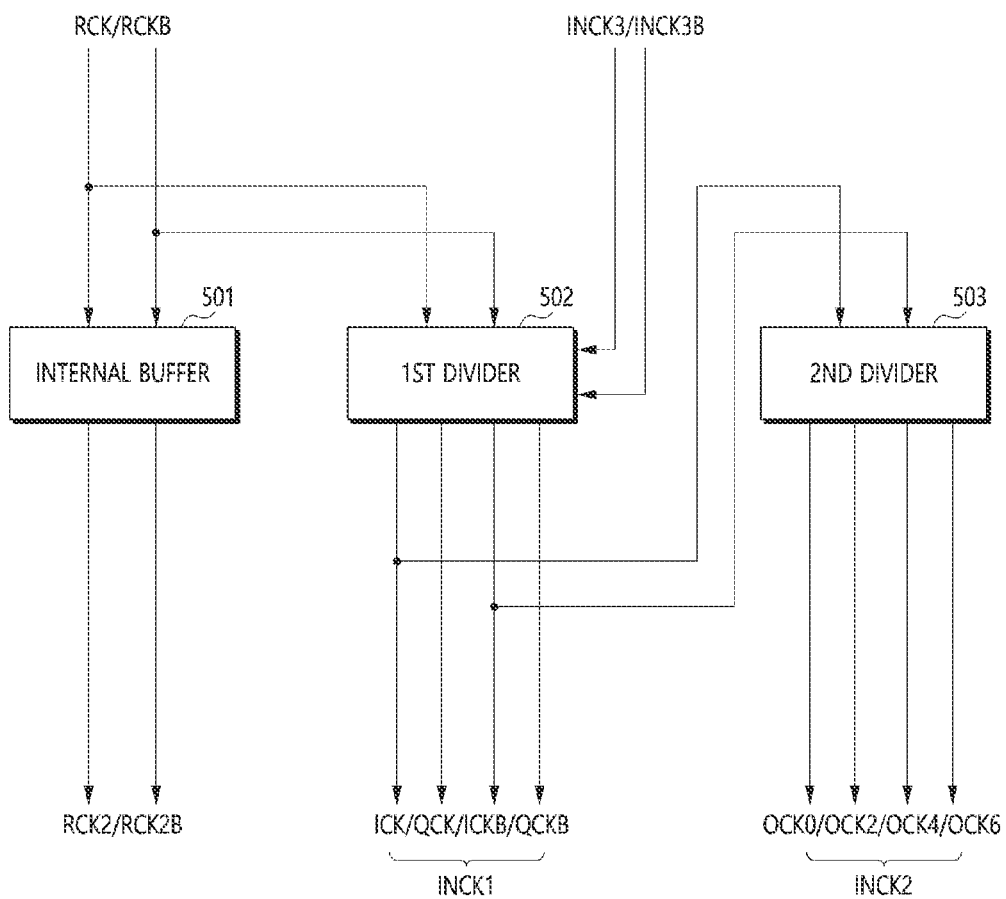
FIG. 6 is a block diagram illustrating a configuration of a multi-phase clock generating circuit in accordance with an embodiment.

FIG. 6 is a block diagram illustrating a configuration of a multi-phase clock generating circuit 500 in accordance with an embodiment. The multi-phase clock generating circuit 500 of FIG. 6 may be applied as the multi-phase clock generating circuit 450 illustrated in FIG. 5. Hereinafter, described with reference to FIGS. 5 and 6 will be the configuration and the operation of the multi-phase clock generating circuit 500 in accordance with an embodiment. The multi-phase clock generating circuit 500 may receive the first reference clock signal pair RCK/RCKB from the first selecting circuit 440. The multi-phase clock generating circuit 500 may receive the third internal clock signal pair INCK3/INCK3B from the second selecting circuit 480. Based on the first reference clock signal pair RCK/RCKB and the third internal clock signal pair INCK3/INCK3B, the multi-phase clock generating circuit 500 may generate the second reference clock signal pair RCK2/RCK2B, the first internal clock signals INCK1, and the second internal clock signals INCK2. The multi-phase clock generating circuit 500 may output, as the second reference clock signal pair RCK2/RCK2B, at least one of the first reference clock signal pair RCK/RCKB and the third internal clock signal pair INCK3/INCK3B. The multi-phase clock generating circuit 500 may generate the first internal clock signals INCK1 by dividing at least one of the first reference clock signal pair RCK/RCKB and the third internal clock signal pair INCK3/INCK3B. The first internal clock signals INCK1 may include a plurality of internal clock signals. Further, the multi-phase clock generating circuit 500 may generate the second internal clock signals INCK2 by dividing the first internal clock signals INCK1. The second internal clock signals INCK2 may include a plurality of internal clock signals. The first internal clock signals INCK1 may include an internal clock signal ICK, an internal clock signal QCK, an internal clock signal ICKB, and an internal clock signal QCKB. The second internal clock signals INCK2 may include an internal clock signal OCK0, an internal clock signal OCK2, an internal clock signal OCK4, and an internal clock signal OCK6. In an embodiment, the multi-phase clock generating circuit 500 may divide the first internal clock signals INCK1 based on the third internal clock signal pair INCK3/INCK3B, which are the output signals from the second selecting circuit 480 illustrated in FIG. 5.

The multi-phase clock generating circuit 500 may include an internal buffer 501, a first divider 502, and a second divider 503. The internal buffer 501 may buffer the first reference clock signal pair RCK/RCKB to output the buffered signals as the second reference clock signal pair RCK2/RCK2B. For example, the internal buffer 501 may differentially amplify the first reference clock signal pair RCK/RCKB. The internal buffer 501 may be a differential amplifier configured to differentially amplify the first reference clock signal pair RCK/RCKB. The second reference clock signal pair RCK2/RCK2B may have substantially the same phase difference and substantially the same frequency as the first reference clock signal pair RCK/RCKB. The first divider 502 may divide the first reference clock signal pair RCK/RCKB to generate the first internal clock signals INCK1. The first internal clock signals INCK1 may include the plurality of first internal clock signals. For example, the first divider 502 may divide frequency of the first reference clock signal pair RCK/RCKB by 2 to generate the first internal clock signals INCK1. The first internal clock signals INCK1 may include the internal clock signal ICK, the internal clock signal QCK, the internal clock signal ICKB, and the internal clock signal QCKB. Each of the plurality of first internal clock signals ICK, QCK, ICKB, and QCKB may have a frequency twice lower than the first reference clock signal pair RCK/RCKB. The plurality of first internal clock signals ICK, QCK, ICKB, and QCKB may sequentially have a phase difference of 90° between each other. The plurality of first internal clock signals ICK, QCK, ICKB, and QCKB may the same frequency. The first divider 502 may receive the third internal clock signal pair INCK3/INCK3B. Based on the third internal clock signal pair INCK3/INCK3B, the first divider 502 may divide the first reference clock signal pair RCK/RCKB. For example, the first divider 502 may divide the first reference clock signal pair RCK/RCKB in synchronization with a rising edge or a falling edge of the third internal clock signal pair INCK3/INCK3B. The first divider 502 may divide the first reference clock signal pair RCK/RCKB in synchronization with the third internal clock signal pair INCK3/INCK3B, which increases the signal characteristics of the first internal clock signals INCK1.

The second divider 503 may further generate the second internal clock signals INCK2 by dividing the first internal clock signals INCK1. The second internal clock signals INCK2 may include the plurality of second internal clock signals. For example, the second divider 503 may divide frequency of the first internal clock signals INCK1 by two to generate the second internal clock signals INCK2. The second internal clock signals INCK2 may include the internal clock signal OCK0, the internal clock signal OCK2, the internal clock signal OCK4, and the internal clock signal OCK6. Each of the plurality of second internal clock signals OCK0, OCK2, OCK4, and OCK6 may have a frequency four (4) times lower than the first reference clock signal pair RCK/RCKB. The plurality of second internal clock signals OCK0, OCK2, OCK4, and OCK6 may sequentially have a phase difference of 90° between each other.

In an embodiment, the multi-phase clock generating circuit 500 illustrated in FIG. 6 may be applied as any of the multi-phase clock generating circuit 124 illustrated in FIG. 1, the multi-phase clock generating circuit 250 illustrated in FIG. 2, and the multi-phase clock generating circuit 350 illustrated in FIG. 4.

When the multi-phase clock generating circuit 500 illustrated in FIG. 6 is applied as the multi-phase clock generating circuit 124 illustrated in FIG. 1, the internal buffer 501 illustrated in FIG. 6 may be modified to output, as the third internal clock signal pair INCK3/INCK3B, one of the first clock signal pair CK1/CK1B, the second clock signal pair CK2/CK2B, and the third clock signal pair CK3/CK3B instead of the first reference clock signal pair RCK/RCKB. Further, the first divider 502 illustrated in FIG. 6 may be modified to divide one of the first clock signal pair CK1/CK1B, the second clock signal pair CK2/CK2B, and the third clock signal pair CK3/CK3B to generate the first internal clock signals INCK1. In an embodiment, the first divider 502 may be modified not to receive the third internal clock signal pair INCK3/INCK3B. The second divider 503 may further generate the second internal clock signals INCK2 by dividing the first internal clock signals INCK1.

When the multi-phase clock generating circuit 500 illustrated in FIG. 6 is applied as the multi-phase clock generating circuit 250 illustrated in FIG. 2, the internal buffer 501 illustrated in FIG. 6 may be modified to output the first reference clock signal pair RCK/RCKB as the third internal clock signal pair INCK3/INCK3B. In an embodiment, the first divider 502 might not receive the third internal clock signal pair INCK3/INCK3B.

When the multi-phase clock generating circuit 500 illustrated in FIG. 6 is applied as the multi-phase clock generating circuit 350 illustrated in FIG. 4, the first divider 502 illustrated in FIG. 6 may be modified not to receive the third internal clock signal pair INCK3/INCK3B from the second selecting circuit 380 illustrated in FIG. 4.

While certain embodiments have been described above, it will be understood by those skilled in the art that the embodiments described are by way of example only. Accordingly, the semiconductor apparatus including the plurality of clock paths and the semiconductor system using the same should not be limited based on the described embodiments. Rather, the semiconductor apparatus including the plurality of clock paths and the semiconductor system using the same described herein should only be limited by the claims that follow when taken in conjunction with the above description and accompanying drawings.

What is claimed is:

1. A semiconductor apparatus including a plurality of clock paths, the semiconductor apparatus comprising:
   a first clock path configured to buffer a system clock signal pair to generate a first clock signal pair in a first operation mode;
   a second clock path configured to multiply a frequency of the system clock signal pair to generate a second clock signal pair in a second operation mode;
   a third clock path configured to convert the system clock signal pair to a Complementary Metal-Oxide-Semiconductor (CMOS) level to generate a third clock signal pair in a third operation mode;
   a first selecting circuit configured to output, as a first reference clock signal pair, one of the first clock signal pair, the second clock signal pair, and the third clock signal pair according to the operation mode; and
   a multi-phase clock generating circuit configured to generate first internal clock signals from the first reference clock signal pair.

2. The semiconductor apparatus of claim 1,
   wherein the system clock signal pair in the first operation mode has a frequency within a first frequency range,
   wherein the system clock signal pair in the second operation mode has a frequency within a second frequency range higher than the first frequency range, and wherein the system clock signal pair in the third operation mode has a frequency within a third frequency range higher than the second frequency range.

3. The semiconductor apparatus of claim 1, wherein the system clock signal pair in the second operation mode has a phase difference of 90°.

4. The semiconductor apparatus of claim 1, wherein the system clock signal pair in any of the first operation mode and the third operation mode has a phase difference of 180°.

5. The semiconductor apparatus of claim 1, wherein each of the first clock signal pair, the second clock signal pair, and the third clock signal pair has a phase difference of 180°.

6. The semiconductor apparatus of claim 1, wherein the multi-phase clock generating circuit is configured to output the first reference clock signal pair as the first internal clock signals or configured to divide the first reference clock signal pair to generate the first internal clock signals.

7. The semiconductor apparatus of claim 1, wherein the first clock path includes:
a first receiving circuit configured to receive the system clock signal pair; and
a buffer circuit configured to buffer output signals from the first receiving circuit to generate the first clock signal pair.

8. The semiconductor apparatus of claim 1, wherein the second clock path includes:
a second receiving circuit configured to receive the system clock signal pair; and
a multiplier configured to multiply a frequency of output signals from the second receiving circuit to generate the second clock signal pair.

9. The semiconductor apparatus of claim 1, wherein the third clock path includes:
a third receiving circuit configured to receive the system clock signal pair; and
a converter configured to convert output signals from the third receiving circuit to the CMOS level to generate the third clock signal pair.

10. A semiconductor apparatus including a plurality of clock paths, the semiconductor apparatus comprising:
a first clock path configured to buffer a system clock signal pair to generate a first clock signal pair in a first operation mode;
a second clock path configured to multiply a frequency of the system clock signal pair to generate a second clock signal pair in a second operation mode;
a third clock path configured to convert the system clock signal pair to a Complementary Metal-Oxide-Semiconductor (CMOS) level to generate a third clock signal pair and configured to buffer the system clock signal pair to a Current Mode Logic (CML) level to generate a fourth clock signal pair, in a third operation mode;
a first selecting circuit configured to select, as a first reference clock signal pair, one of the first clock signal pair, the second clock signal pair, and the third clock signal pair according to the operation mode;
a multi-phase clock generating circuit configured to generate first internal clock signals, second internal clock signals, and a second reference clock signal pair from the first reference clock signal pair; and
a second selecting circuit configured to select, according to the operation mode, at least one of the second reference clock signal pair and the fourth clock signal pair to output the selected pair as a third internal clock signal pair.

11. The semiconductor apparatus of claim 10,
wherein the system clock signal pair in the first operation mode has a frequency within a first frequency range,
wherein the system clock signal pair in the second operation mode has a frequency within a second frequency range higher than the first frequency range, and
wherein the system clock signal pair in the third operation mode has a frequency within a third frequency range higher than the second frequency range.

12. The semiconductor apparatus of claim 10,
wherein the system clock signal pair in the second operation mode has a phase difference of 90°, and
wherein the system clock signal pair in any of the first operation mode and the third operation mode has a phase difference of 180°.

13. The semiconductor apparatus of claim 10, wherein the multi-phase clock generating circuit is configured to output the first reference clock signal pair as the second reference clock signal pair or configured to divide the first reference clock signal pair to generate the first internal clock signals and the second internal clock signals.

14. The semiconductor apparatus of claim 10, wherein the first clock path includes:
a first receiving circuit configured to receive the system clock signal pair; and
a buffer circuit configured to buffer output signals from the first receiving circuit to generate the first clock signal pair.

15. The semiconductor apparatus of claim 10, wherein the second clock path includes:
a second receiving circuit configured to receive the system clock signal pair; and
a multiplier configured to multiply a frequency of output signals from the second receiving circuit to generate the second clock signal pair.

16. The semiconductor apparatus of claim 10, wherein the third clock path includes:
a third receiving circuit configured to receive the system clock signal pair;
a first converter configured to convert output signals from the third receiving circuit to the CMOS level to generate the third clock signal pair;
a CML buffer configured to buffer the output signals from the third receiving circuit to the CML level; and
a second converter configured to convert output signals from the CML buffer to the CMOS level to generate the fourth clock signal pair.

17. A semiconductor apparatus including a plurality of clock paths, the semiconductor apparatus comprising:
a first clock path configured to buffer a system clock signal pair to generate a first clock signal pair in a first operation mode;
a second clock path configured to multiply a frequency of the system clock signal pair to generate a second clock signal pair in a second operation mode;
a third clock path configured to convert the system clock signal pair to a Complementary Metal-Oxide-Semiconductor (CMOS) level to generate a third clock signal pair and configured to buffer the system clock signal pair to a Current Mode Logic (CML) level to generate a fourth clock signal pair, in a third operation mode;
a first selecting circuit configured to selecting, as a first reference clock signal pair, one of the first clock signal pair, the second clock signal pair, and the third clock signal pair according to the operation mode;
a multi-phase clock generating circuit configured to generate first internal clock signals, second internal clock signals, and a second reference clock signal pair based on at least one of a third internal clock signal pair and the first reference clock signal pair; and a second selecting circuit configured to select one of the second reference clock signal pair and the fourth clock signal pair to output the selected pair as the third internal clock signal pair.

18. The semiconductor apparatus of claim 17, wherein the system clock signal pair in the first operation mode has a frequency within a first frequency range, wherein the system clock signal pair in the second operation mode has a frequency within a second frequency range higher than the first frequency range, and wherein the system clock signal pair in the third operation mode has a frequency within a third frequency range higher than the second frequency range.

19. The semiconductor apparatus of claim 17, wherein the system clock signal pair in the second operation mode has a phase difference of 90°, and wherein the system clock signal pair in any of the first operation mode and the third operation mode has a phase difference of 180°.

20. The semiconductor apparatus of claim 17, wherein the multi-phase clock generating circuit is configured to output, as the second reference clock signal pair, one of the first reference clock signal pair and the third internal clock signal pair or configured to divide one of the first reference clock signal pair and the third internal clock signal pair to generate the first internal clock signals and the second internal clock signals.

21. The semiconductor apparatus of claim 17, wherein the first clock path includes:

a first receiving circuit configured to receive the system clock signal pair; and a buffer circuit configured to buffer output signals from the first receiving circuit to generate the first clock signal pair.

22. The semiconductor apparatus of claim 17, wherein the second clock path includes:

a second receiving circuit configured to receive the system clock signal pair; and a multiplier configured to multiply a frequency of output signals from the second receiving circuit to generate the second clock signal pair.

23. The semiconductor apparatus of claim 17, wherein the third clock path includes:

a third receiving circuit configured to receive the system clock signal pair;

a first converter configured to convert output signals from the third receiving circuit to the CMOS level to generate the third clock signal pair;

a CML buffer configured to buffer the output signals from the third receiving circuit to the CML level; and a second converter configured to convert output signals from the CML buffer to the CMOS level to generate the fourth clock signal pair.

* * * * *